(12) United States Patent
Nishide et al.

(10) Patent No.: US 7,876,596 B2
(45) Date of Patent: Jan. 25, 2011

(54) MEMORY ELEMENT AND METHOD FOR MANUFACTURING SAME

(75) Inventors: Hiroyuki Nishide, Tokyo (JP); Kenji Honda, Tokyo (JP); Yasunori Yonekuta, Tokyo (JP); Takashi Kurata, Tokyo (JP); Shigemoto Abe, Tokyo (JP)

(73) Assignee: Waseda University, Tokyo (JP)

( * ) Notice: Subject to any disclaimer, the term of this patent is extended or adjusted under 35 U.S.C. 154(b) by 631 days.

(21) Appl. No.: 11/575,091

(22) PCT Filed: Nov. 4, 2005

(86) PCT No.: PCT/JP2005/020320

§ 371 (c)(1),
(2), (4) Date: Nov. 28, 2007

(87) PCT Pub. No.: WO2006/049261

PCT Pub. Date: May 11, 2006

(65) Prior Publication Data

US 2008/0259680 A1    Oct. 23, 2008

(30) Foreign Application Priority Data

Nov. 8, 2004    (JP)    ............... 2004-324280

(51) Int. Cl.
*G11C 11/00* (2006.01)
(52) U.S. Cl. .................. 365/148; 365/174; 365/138; 257/154; 257/359; 257/746; 257/218
(58) Field of Classification Search ............... 365/148, 365/138, 174; 257/154, 359, 746, 218
See application file for complete search history.

(56) References Cited

U.S. PATENT DOCUMENTS 4,371,883 A    2/1983   Potember et al.

(Continued)

FOREIGN PATENT DOCUMENTS

JP    S62095882    5/1987

(Continued)

OTHER PUBLICATIONS

Ma, et al., 2003. "Nonvolatile electrical bistability of organic/metal-nanocluster/organic system". Applied Physics Letters 82: 1419-1421.

(Continued)

*Primary Examiner*—Vu A Le
*Assistant Examiner*—Han Yang
(74) *Attorney, Agent, or Firm*—McDermott Will & Emery LLP

(57) ABSTRACT

A novel nonvolatile memory element, which can be manufactured by a simple and high yield process by using an organic material and has a high on/off ratio, and a method for manufacturing such nonvolatile memory element. A switching layer (14) made of an electrical insulating radical polymer is provided between an anode layer (12) and a cathode layer (16). Further, a hole injection transport layer (13) is provided between the switching layer (14) and the anode layer (12), and an electron injection transport layer (15), between the switching layer (14) and the cathode layer (16). An intermediate layer is provided between the switching layer and the adjacent layer. The radical polymer is preferably nitroxide radical polymer. The switching layer (14), the hole injection transport layer (13) and the electron injection transport layer (15) are formed by being stacked by a wet process.

9 Claims, 12 Drawing Sheets

U.S. PATENT DOCUMENTS

| | | | |
|---|---|---|---|
| 6,055,180 | A | 4/2000 | Gudesen et al. |
| 6,326,936 | B1 | 12/2001 | Inganas et al. |
| 2002/0163828 | A1 | 11/2002 | Krieger et al. |
| 2003/0017623 | A1 | 1/2003 | Li et al. |
| 2003/0075715 | A1* | 4/2003 | Satoh et al. ............. 257/40 |
| 2003/0155602 | A1 | 8/2003 | Krieger et al. |
| 2004/0027849 | A1 | 2/2004 | Yang et al. |
| 2004/0084670 | A1* | 5/2004 | Tripsas et al. ............. 257/40 |
| 2004/0160801 | A1* | 8/2004 | Krieger et al. ............. 365/151 |
| 2005/0213413 | A1* | 9/2005 | Schmid et al. ............. 365/226 |
| 2008/0259680 | A1* | 10/2008 | Nishide et al. ............. 365/174 |

FOREIGN PATENT DOCUMENTS

| | | |
|---|---|---|
| JP | S62095883 | 5/1987 |
| JP | H03137894 | 6/1991 |
| JP | H03137896 | 6/1991 |
| JP | H04010654 | 1/1992 |
| JP | H09036389 | 2/1997 |
| JP | 2003092410 | 3/2003 |
| JP | 2004040094 | 2/2004 |
| WO | 02091385 | 11/2002 |

OTHER PUBLICATIONS

Potember, et al., 1979. "Electrical switching and memory phenomena in Cu-TCNQ thin films". Applied Physics Letters 34: 405-407.

Moller, et al., 2003. "A ploymer/semiconductor write-once read-many-times memory". Nature 426: 166-169.

Iwasa, et al., 1989. "Switching effect in organic charge transfer complex crystals". Applied Physics Letters 55: 2111.

Simmons, et al., 1967. "New conduction and reversible memory phenomena in thin insulating films". Proceedings of The Royal Society A301: 77.

Sakamoto, et al., 2003. "Nanometer-scale switches using copper sulfide". Applied Physics Letters 82: 3032.

Ma, et al., 2004. "Organic nonvolatile memory by controlling the dynamic copper-ion concentration within organic layer". Applied Physics Letters 84: 4908.

Ma, et al., 2002. "Prganic electrical bistable devices and rewritable memory cells". Applied Physics Letters 80: 2997.

Bozano, et al., 2004. "Mechanism for bistability in organic memory elements". Applied Physics Letters 84: 607.

Kawakami, et al., 2003. "Electrical Bistable Behaviors of Organic Materials in Single Layer Structure". SPIE 5217: 71.

Nishide, et al., 2002. "Organic Polymer Magnet". Kobunshi High Polymers, Japan 51: 453-459.

Lahti, Paul M., ed., Magnetic Properties of Organic Materials , pp. 285-303.

* cited by examiner

US 7,876,596 B2

MEMORY ELEMENT AND METHOD FOR MANUFACTURING SAME

CROSS REFERENCE TO PRIOR APPLICATIONS

This is a U.S. national phase application under 35 U.S.C. §371 of International Patent Application No. PCT/JP2005/020320, filed Nov. 4, 2005, which claims the benefit of Japanese Application No. 2004-324280, filed Nov. 8, 2004, both of which are incorporated by reference herein. The International Application was published in Japanese on May 11, 2006 as International Publication No. WO 2006/049261 A1 under PCT Article 21(2).

TECHNICAL FIELD

The present invention relates to a nonvolatile memory element whose on-off states are switched according to an applied voltage to keep each of the switched states, and a manufacturing method thereof. More particularly, the present invention relates to a polymer material which is to become the most important constituent in manufacturing next-generation ultrahigh-density nonvolatile memories that are expected to replace nonvolatile flash memories widely used at present, as well as an element structure using such polymer material.

BACKGROUND ART

Conventionally, volatile memory elements, such as DRAM and SRAM, using silicon substrates have been widely used. In the future, however rewritable and nonvolatile memory elements are expected to be developed. Nevertheless, conventional manufacture of memory elements using silicon substrates have required photolithography, which is such a troublesome and expensive process that there has been a problem that memory elements as end products become too expensive. As alternatives to such conventional memory elements using silicon substrates, some nonvolatile memory elements using organic materials are proposed.

For example, as memory elements using organic low molecular compounds capable of yielding an abrupt change in electric conductivity in response to a change in applied voltage, there are proposed memory elements using 2-amino-4,5-imidazolecarbonitrile (Applied Physics Letters, by L. Ma et al., 82(9), p 1419-1421 (2003)) or those using 7,7,8,8-tetracyanoquinodimethane copper complex (Applied Physics Letters, by R. S. Potember et al., 34(6), p 405-407 (2003)).

Those memory elements using organic low molecular compounds include a conducting layer such as that of metallic aluminum in an organic layer or between an electrode layer and an organic layer. By applying a voltage not less than a threshold voltage, they change from a high-resistivity state to a low-resistivity state to thereby keep the low-resistivity state permanently. When a reverse voltage is applied to those elements in such low-resistivity state, they will return to the high-resistivity state at a given threshold.

Although the mechanism of the change in resistivity by the application of voltage still remains to be explained, it may be attributed to some electrical interface phenomenon caused by space charges accumulated on an interface between the conducive layer and the organic layer or between the organic layer and the electrode layer provided in the interior of the memory element.

According to the memory elements using such organic low molecular compounds, however, the manufacturing process thereof is complicated, and the production yield of the memory elements is not high, as they are produced by forming a thin film of the low molecular compounds through the processes requiring ultrahigh vacuum condition, such as vacuum deposition method, electron beam method, sputtering method, etc.

On the other hand, some attempts to manufacture memory elements using organic high polymer compounds have been made. For example, there is proposed a single-layer-type memory element in which the mixture (PEDOT:PSS) of poly (3,4-ethylenedioxythiophene) and poly(styrene sulfonate) is provided between an anode comprised of indium tin oxide (ITO) and a cathode comprised of aluminum (by S. Moller et al, Nature, 426, p 166-169 (2003)).

Whilst the memory elements obtained by using such organic high polymer compounds change from a low-resistivity state to a high-resistivity state by applying a voltage not less than a threshold voltage, yet an on-off ratio thereof was not so high. In addition, as PEDOT:PSS is water-soluble polymer, there has been a problem that formation of a uniform layer of PEDOT:PSS is difficult, resulting in difficulties in forming multilayer memory elements.

Further, although various types of nonvolatile memory elements have been developed until now, there are different problems involved in any type thereof. Flash memories have already been come into practical use, but they operate slower than DRAM or SRAM. Besides, they have a limitation in write cycle life. In an attempt to overcome the problems, various types of elements such as FeRAM, SONOS/NROM, MRAM and the like have been developed, yet any of them needs the vacuum deposition process at the time of manufacturing, since they employ ceramic materials such as metal oxides and sulfides, thus leading to high manufacturing cost. To meet a demand to manufacture flexible and large-area elements at low cost, it is imperative that materials such as organic polymers as well as an inexpensive wet process such as a spin-coating process be employed.

Under the circumstances, TFE (Thin Film Electronics) AB proposed, jointly with Intel Corporation, a certain polymer memory using ferroelectric polymers such as homopolymer of vinylidene fluoride or copolymer of trifluorovinylidene and trifluoroethylene (U.S. Pat. Nos. 6,055,180, 6,326,936; US Patent Application Publication No. 2003/0017623A1). One of the problems of the element is in that it is not able to perform nondestructive readout after writing. To solve the problem, Xerox Corporation developed a nonvolatile memory which makes both writing and reading repeatable, using a multilayered element comprised of similar polymer material and organic semiconductor (Japanese Unexamined Patent Application Publication No. 2004-040094). All of them, however, use a fluorinated polymer, thus leading to high cost in terms of both material and process.

On the other hand, AMD Inc. in the United States proposed, using a basic technique of Coatue Corp, a venture company of UCLA, a memory element adopting a new principle different from that of the foregoing ferroelectric polymer (U.S. patent Application Publication Nos. 2003/0155602A1, 2002/0163828A1; WO 02091385). That is to say, the element has a structure in which pi-conjugated polymer (for example, polyacetylene or polyaniline or the like), doped with ionic-dissociation salt such as sodium chloride or cesium chloride, is sandwiched between two metal electrodes. When a voltage is applied to a film of this polymer, then the doping salt thus added is dissociated into plus and minus ions, which are then drawn toward opposite-polarity electrodes, respectively, so that the electric conductivity of the film changes reversibly. Taking advantage of this phenomenon, the switching function thereof is developed. Nevertheless, the reading of this memory is destructive, so the memory is used as a write-only type. In addition, the switching speed is as slow as in msec order. It is attributed to the transfer of relatively large ions in the solid film of the pi-conjugated polymer composed of hard molecular chains.

Although not the ones using the foregoing-mentioned polymer materials, other types of memory elements using low molecule organic materials also have been studied by many groups in the past. As a pioneering example, R. S. Potember et al. (Johns Hopkins University) proposed a memory element which has such a structure that tetracyanoquinodimethane (TCNQ) thin film is sandwiched between two copper electrodes (U.S. Pat. No. 4,371,883; Appl. Phys. Lett., ((1979), 34(6), 405). TCNQ is known to be a compound having strong electron acceptability, allowing electrons to transfer to and from copper, thus forming a sort of charge-transfer type complex (CT complex). It is considered that a layer of such CT complex is formed to an about 10 micrometer thickness on an interface between TCNQ and the copper electrodes, thus allowing the switching function to appear. The switching speed of this element is extremely fast, as fast as 10 nanoseconds, and besides, on-off ratio is 10,000 or above, and therefore, it attracted attention as a promising memory element. This initiated the active studies of the application of CT complex to a switch/memory element. Particularly in Japan, Gunji SAITO et al. took the lead in the studies of various types of CT complexes in the TCNQ system (Appl. Phys. Lett., (1989), 55(20), 2111). Some companies also filed several patent applications in this connection (For example, Japanese Unexamined Patent Application Publication Nos. 62-095882 and 62-095883 filed by Canon Inc.: Japanese Unexamined Patent Application Publication Nos. 03-137894 and 03-137896 by Matsushita Electric Works, Ltd.). Although there are varying explanations about the mechanism thereof, a likely explanation is that electric conductivity of the film changes because of the transfer of CT complex from a crystalline phase to an amorphous phase due to the generation of Joule heat associated with applied voltage. In any case, films having evaporated organic low molecular crystals involve many technical difficulties in obtaining uniform films, and there remains a problem to be solved in terms of production cost as well.

There was studied another example of a memory element that uses copper electrodes like in the foregoing-mentioned example yet has a different mechanism from that of Potember et al. It has long been known that applying a voltage to two metal electrodes (of gold, copper or the like) with a thin film of organic polymer, metal oxide or sulfide being sandwiched therebetween, causes the metal used as electrodes to ionize in an electrical field and transfer in the film. It was J. G. Simmons and R. R. Verderber who showed the theoretical feasibility of application of this phenomenon to a switch element (Proc. Roy. Soc., (1967), A301, 77). It is believed that copper ions thus produced are allowed to transfer toward the counter electrodes and then reduced to metal copper, and then finally reach them after growing in a filamentary structure in the film, thus allowing electrically conductive paths to be formed therein. Taking advantage of such acting mechanism, NEC Corporation proposed a certain novel switch element (Appl. Phys. Lett., (2003), 82(18), 3032). On the other hand, a group of Y. Yang et al. attributed what makes contribution to such electrical conductivity not to metal copper, but to copper ions (Appl. Phys. Lett., (2004), 84(24), 4908). Since the used materials are different, discussion on the same premise is impossible. Anyway, it is attracting attention that such elements do have switching function or memory function. It should be noted, however, that this type of elements also has a problem that switching speed is rather slow (microsecond order).

Further, Y. Yang et al. (University of California) used as a memory an element having a five-layer structure in which an imidazole-based compound of low molecular weight is sandwiched between two aluminum electrodes, and another aluminum layer is placed in an intermediate layer thus formed (US Patent Application Publication No. 2004/0,027,849A1; Appl. Phys. Lett., (2002)), 80(16), 2997). Here, it is believed that the intermediate aluminum layer acts as if a floating gate electrode of a flash memory. In other words, space charges are stored therein, so that the memory function appears due to the charges coming in and out therefrom. On the other hand, J. C. Scott et al. (IBM in the United States) examined another element as a memory, said element having such a structure that nanoparticles of metals (e.g., gold or the like) are homogeneously dispersed in an organic layer instead of providing the foregoing-mentioned intermediate aluminum layer (Appl. Phys. Lett., (2004), 84,607). As for terminal electrodes, they used aluminum electrodes as Yang et al did so. They explained that what is important for the stable driving of the element is not the form of the metal (whether in the form of thin film or in particles) in the organic layer, but the formation of an ultrathin oxide layer on a surface of the aluminum terminal electrode contacting the organic layer. A group of Fuji Electric Co., Ltd, however, reported that the same memory characteristic appears event though the organic layer contains no metal. (by H. Kawakami et al., Proc. SPIE (2003), vol. 5217, 71). Thus, the operative mechanism of that kind of elements still needs careful examination.

As explained above, there is no perfect key approach proposed at this time yet to developing materials and process so as to manufacture a flexible, large-area and rewritable memory element at low cost. There is not any practically satisfactory solution yet in terms of basic characteristic, such as switching speed, writing/reading repeatability, memory retention time, etc, as well as production cost.

DISCLOSURE OF THE INVENTION

To solve the foregoing problems, the spin-coating of organic polymer material is still the most appropriate approach. It is imperative that not an expensive polymer such as fluorinated polymer, but inexpensive material and process compatible with the spin coating process be selected. In view of the foregoing-mentioned, the inventors of the present invention have succeeded in synthesizing a novel, high-performance and electrochemically-active radical polymer at low cost, and, have found out a method for easily manufacturing a rewritable nonvolatile memory element. Furthermore, the inventors of the present invention have found it out that the memory retention ability and/or drive stability improve remarkably by inserting a thin film of a polymer selected from among a dielectric material, an electron or ion conductor and an insulator into such radical polymer layer, and then stacking thereon an active material facing the radical polymer with such thin film being sandwiched, whereby the inventors of the present invention have come up with the present invention The memory element of the present invention is characterized by the provision of a switching layer comprising an insulating radical polymer between an anode layer and a cathode layer, whereby it is possible to provide a novel nonvolatile memory element which is able to be manufactured by a simple and high-yield process, having a high on-off ratio.

Further, the memory element of the present invention is able to improve the on-off ratio by including a hole injection transport layer between the foregoing switching layer and the anode layer or an electron injection transport layer therebetween.

Moreover, the memory element of the present invention includes an intermediate layer composed of a material which is selected from a dielectric, an electron or ion conductor or an insulator, and separates or partitions the foregoing switching layer into two layers, thus enabling the memory retention ability and/or drive stability of the memory element to be improved drastically.

More specifically, the memory element of the present invention may include an intermediate layer composed of the material selected from a dielectric, an electron or ion conductor and an insulator between the foregoing switching layer and the foregoing anode layer, or between the foregoing switching layer and the cathode layer, thus enabling the memory retention ability and/or drive stability of the memory element to be improved drastically.

Still also, the memory element of the present invention may include a redox layer between the foregoing switching layer and the cathode layer, or between the foregoing switching layer and the anode layer, or may further include an intermediate layer composed of a material selected from a dielectric, an electron or ion conductor and an insulator between the foregoing switching layer and the redox layer, thus enabling the memory retention ability and/or drive stability of the memory element to be improved even more drastically.

Still further, the foregoing radical polymer is nitroxide radical polymer, and thus the memory element of the present invention can make response characteristic prompt.

In addition to the foregoing, since the foregoing intermediate layer of the memory element of the present invention comprises cyanoethylated polymer, it is well compatible with the radical polymer and can be produced by a simple and high-yield process.

The method for manufacturing a memory element according to the present invention is a method to manufacture a memory element including: a switching layer composed of an insulating radical polymer between an anode layer and a cathode layer; a hole injection transport layer between the switching layer and the anode layer; and an electron injection transport layer between the switching layer and the cathode layer, wherein the foregoing switching layer, the hole injection transport layer and the electron injection transport layer are stacked by a wet process, thus enabling the homogeneity of the quality of each film layer to be maintained, and the memory element to be manufactured by a simple and high-yield process.

Alternatively, the method for manufacturing a memory element according to the present invention is a method to manufacture a memory element including: a switching layer composed of an insulating radical polymer between the anode layer and a cathode layer; and an intermediate layer which partitions the foregoing switching layer into two layers, wherein the foregoing switching layer and the intermediate layer are stacked by a wet process, thus enabling the homogeneity of the quality of each film layer to be maintained, and the memory element to be manufactured by a simple and high-yield process.

BEST MODE FOR CARRYING OUT THE INVENTION

Figure 1:
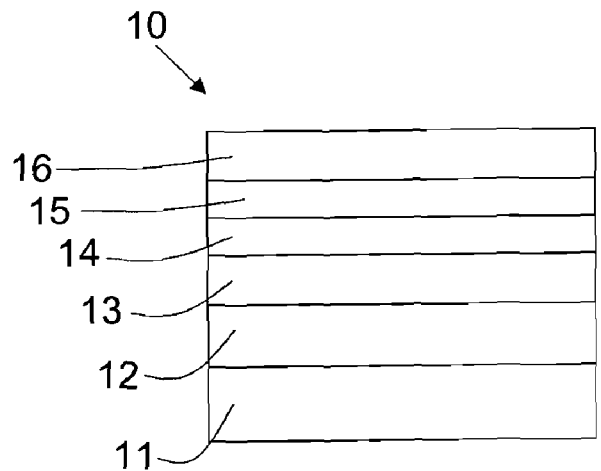
FIG. 1 is a schematic view showing a memory element in accordance with Example 1 of the present invention.

Hereinafter, a memory element of the present invention and a method for manufacturing the same will be explained in detail.

As a radical polymer forming the switching layer of the memory element of the present invention, an insulating radical polymer whose oxidation-reduction reaction is prompt and reversible may preferably be used. The present inventors have studied such radical polymers over the years. (For example, Kobunshi (High Polymers, Japan) by Nishide et al. vol. 51(63), p 453-459 (1996); Magnetic Properties of Organic Materials by H. Nishide et al., edited by P. M. Lathti, p 285-303 (1999) and so on). For the memory element of the present invention may be used polymers containing nitroxide radical, aminium radical, phenoxy radical, etc.

Among those polymers, nitroxide radical polymers containing nitroxide may preferably be used. This is because, as shown in chemical formula 1, both one-electron oxidation and one-electron reduction are generally available in nitroxide radical polymers, which indicate the reversible oxidation-reduction property of unpaired electron, and the oxidation-reduction process thereof, that is to say, the response characteristic thereof, is prompt, stable, long-lived and repeatable. Also, nitroxide radical polymers have an advantage that stable treatment is possible up to at 250 deg C. Further, nitroxide radical polymers have a low electrical conductivity and thus, it can retain carriers for a long time.

Chemical formula 1

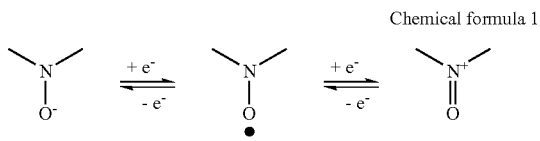

In the meantime, it should be noted that the radical polymers used in the present invention are not limited to the foregoing.

As a synthesis method of an organic polymer containing nitroxide radical, for example, dispersion element may be synthesized by blending 2,2,6,6-tetramethylpiperidinyloxyradical (hereafter, simply abbreviated as TEMPO) with organic polymer. Alternatively, reactive group may be introduced into TEMPO, and the resultant product may be coupled covalently to polymerizable monomer, and the product thus coupled may be homopolymerized or copolymerized with other monomer having no radical by an ordinary method so that the organic polymer containing nitroxide radical can be produced. As a specific example thereof, the reaction example of the following chemical formula 2 can be shown.

Chemical formula 2

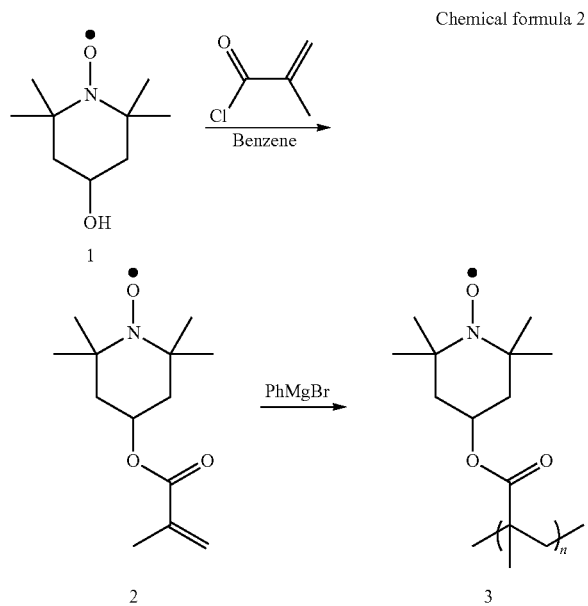

The memory element of the present invention comprises a thin switching layer composed of the electrical-insulating radical polymer between the anode layer and the cathode layer, so that the memory element changes from a high-resistivity state to a low-resistivity state by applying a voltage.

As discussed above, the mechanism of change from the high-resistivity state to the low-resistivity state in association with the application of voltage still remains to be explained for the conventional memory elements using 2-amino-4,5-imidazoledicarbonitrile or 7,7,8,8-tetracyano-quinodimetane complex. In contrast, according to the memory element of the present invention, it is presumed that radicals near the anode are oxidized while those near the cathode are reduced in the switching layer, and thus the charge density reaches a predetermined value by the application of a threshold voltage, whereby cation state and anion state are saturated in the switching layer, forming a conductive path, thus presumably realizing the low-resistivity state. It is also presumed that at such low-resistivity charge-injected state, the insulating switching layer is kept in, so-called a charged state, i.e., in the low-resistivity state durably.

In this way, the memory element of the present invention is configured so that it stays in a high-resistivity state when a voltage applied to between the anode layer and the cathode layer is less than a threshold voltage, while it changes from the high-resistivity state to a low-resistivity state when the applied voltage reaches the threshold voltage or above, and keeps such low-resistivity state even though the voltage becomes less than the threshold value again.

According to a first embodiment of the memory element of the present invention, there is provided a buffer layer between a switching layer and an anode layer or a cathode layer, and thus a good contact interface is formed therebetween and the properties such as an on-off ratio are improved. Specifically, as the buffer layer between the switching layer and the anode layer, there may be provided a hole injection and transport layer composed of a hole injecting and transporting material, while as the buffer layer between the switching layer and the cathode layer, there may be provided an electron injection and transport layer composed of an electron injecting and transporting material.

In the following chemical formulae 3 are shown some examples of nitroxide radical polymers which may preferably be used for the memory element of the present invention. Here, reference symbol (a) denotes poly (4-methacryloyloxy-2,2,6,6-tetramethylpiperidine-1-oxyl), reference symbol (b) denotes poly(4-acryloyloxy-2,2,6,6-tetramethylpiperidine-1-oxyl), reference symbol (c) denotes poly(4-N-t-butyl-N-oxyaminostyrene), reference symbol (d) denotes poly(4-acryloylamino-2,2,6,6-tetramethylpiperidine-1-oxyl), reference symbol (e) denotes poly (4-metacryloylamino-2,2,6,6-tetramethylpiperidine-1-oxyl), reference symbol (f) denotes poly(3,5-di-(N-t-butyl-N-oxylamino) styrene), reference symbol (g) denotes poly(N-t-butylmethacryloylamine-N-oxyl), reference symbol (h) denotes poly(2,2,3,3-tetramethylethylenenitroxide), respectively.

Chemical Formula 3

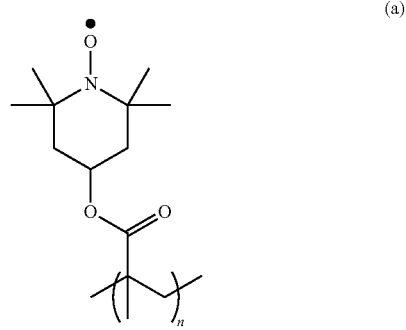

-continued (b) 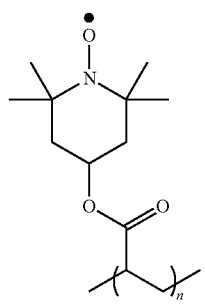

(c) 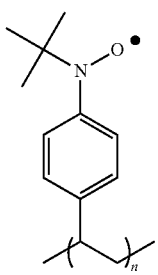

(d) 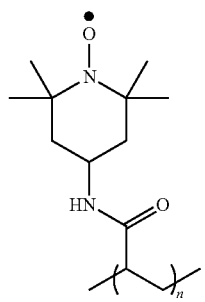

(e) 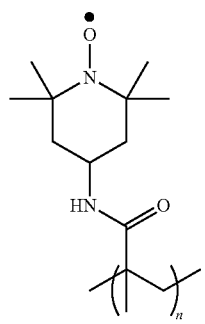

(f) 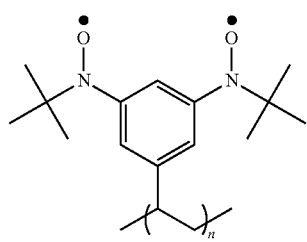

-continued (g) 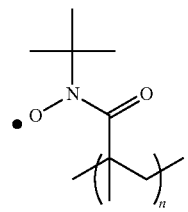

(h) 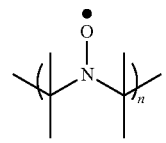

It is desirable that the radical polymer have 10% or more radical per unit of monomer, more appropriately 70% to 100% radical.

Further, as the radical polymer used for the memory element of the present invention may preferably used a high-molecular weight one. Preferably, the molecular weight may be in the order of several thousand or above, more preferably ten thousand to several hundred thousand. Using sufficiently high-molecular weight radical polymer in this way enables a simple film formation process to be performed by a wet process.

What is called "wet process" is a known art to form a thin film of organic polymer. Specifically, spin coat method, ink-jet method, and other various types of print processes are known in general. According to the wet processes, the uniformity and amorphous stability of a switching film formed from radical polymer are kept, thus enabling the high-yield, mass-productive and low-cost production of memory elements.

Besides, skillfully taking advantage of differences in solubilities to a solvent, of the radical polymers for forming a switching layer and the organic materials for forming a hole injection transport layer and an electron injection transport layer, enables the stacking of a switching layer, a hole injection transport layer and an electron injection transport layer by the wet process. Also, by stacking a switching layer, a hole injection transport layer, and an electron injection transport layer by the wet process, flatness and adhesiveness in interface between a switching layer and a hole injection transport layer, or between a switching layer and an electron injection transport layer are ensured, whereby not only the increase of on-off ratio but also the remarkable life extension of the memory element is achieved.

For solubility of the radical polymer used for the memory element of the present invention to solvents, it preferably is soluble in polar organic solvents but insoluble in water. If it is also insoluble in benzene or toluene as nonpolar organic solvents, then it would be more preferable because it facilitates the stacking of an electron injection transport layer that is soluble in nonpolar organic solvent.

A hole injection transport material that constitutes the hole injection transport layer of the memory element of the present invention is chosen appropriately according to the solubility of the radical polymer stacked on the hole injection transport layer to solvent. In the case that the radical polymer is insoluble in water, the use of a water-soluble hole injection transport polymer is preferable. For example, there may be listed a mixture (PEDOT:PSS) of poly(3,4-etylenedioxythiophene) (PEDOT) and poly (styrenesulfonic acid) (PSS), a mixture of poly(aniline) and PSS, polythiophene with alkyl-sulfonate substituted for side chain, polypyrrole derivative, and the like.

Though electron injection transport materials that constitute the electron injection transport layer of the memory element of the present invention are not specifically limited, tris(8-hydroxyquinolinate) aluminum, poly[2-methoxy-5-(2'-ethylhexyloxy)-1,4-phenylenevinylene] (MEH-PPV), phenanthroline derivative or the like may be listed.

As the materials to form the anode layer of the memory element of the present invention, there may be listed oxide semiconductors such as indium tin oxide (ITO) and the like. Although there are no specific limitations in materials to form the cathode layer of the memory element of the present invention, there may be used aluminum, calcium, cesium, lithium fluoride/aluminum, etc.

As a second preferred embodiment of the memory element of the present invention, there may be provided a thin film composed of the material selected from any of dielectric, electron or ion conductor and insulator in the middle of the switching layer, said thin film serving as an intermediate layer which separates the switching layer into two layers so that it may have a multilayer structure, whereby the memory retention ability and/or drive stability of the memory element are improved remarkably.

Alternatively, when one of the two switching layers separated by the intermediate layer is a redox layer, then it will also help the memory element improve its memory retention ability and/or drive stability. Specifically, an intermediate layer may be interposed between the switching layer and the redox layer, while the redox layer is interposed between the switching layer and the cathode layer. Alternatively, the intermediate layer may be interposed between the switching layer and the redox layer, while the redox layer is interposed between the switching layer and the anode layer.

Alternatively, even though one of the switching layers separated by the intermediate layer is omitted, yet the presence of the intermediate layer will help the memory element improve its memory retention ability and/or drive stability. Specifically, the intermediate layer may be arranged between the switching layer and the anode layer without any layer between the intermediate layer and the anode layer. Otherwise, the intermediate layer may be arranged between the switching layer and the cathode layer without any layer between the intermediate layer and the cathode layer.

Alternatively, even though the redox layer is simply arranged between the switching layer and the cathode layer, or between the switching layer and the anode layer, with the intermediate layer being omitted, yet the presence of the redox layer will help the memory element improve its memory retention ability and/or drive stability.

In the meantime, the redox layer mentioned herein is a layer containing a redox reagent, and the term "redox reagent" designates any compounds that have electrochemical activity for receiving electron and hole in general.

As the redox reagent which is included in the redox layer, there may be listed organic compounds such as ferrocene, hydroquinone, quinone, catechol, viologen, phenothiazine and nicotinic-acid amide; metal-bearing compounds such as Prussian blue and tungsten trioxide; or any other compounds which have a group having electron acceptability or electron releasability. Those compounds may be contained in the redox layer by blending them with the organic polymer or introducing them into framework of the organic polymer by covalent bonding. Alternatively, the redox layer may be formed by vapor deposition.

As a material useful as the intermediate layer, there may be listed a polymer of which the permittivity is 7 or above at 1 kHz. Such polymer may be dissolved in a solvent and formed into a thin film as thin as 200 nm or below by the spin coat process, and then stacked so as to be sandwiched between the two switching layers, or between the switching layer and the redox layer, or between the switching layer and the anode layer, or between the switching layer and the cathode layer, thus enabling the intermediate layer to be formed. The intermediate layer should desirably be the thinnest possible unless it becomes thicker than 200 nm, yet it needs to be about 20 nm at minimum due to the need of stacking as a homogeneous layer. Examples of high-dielectric materials useful for such purpose may include: polyvinylidene-fluoride, polydimethylsiloxane, cyanoethyl cellulose, cyanoethyl polyvinyl alcohol, etc. Among them, cyanoethylated polymer is preferable from standpoints of compatibility with the radical polymer, easiness of spin coating, costs, etc. In addition, the high-dielectric material which is used as the intermediate layer may be ceramics.

Other materials useful as the intermediate layer than the foregoing high-dielectric materials include an electron conductor. In other words, even in the case that a metal layer such as evaporated aluminum film is used as the intermediate layer, it will help the memory element drastically improve its memory retention ability and/or drive stability. When such intermediate layer is formed, a homogeneous layer may be formed by means of evaporating. In the case that an ion conductor is used as the intermediate layer, the homogeneous layer may be formed by a solution coating method using a polymer having a low glass transition point (for example, a polymer having polyethylene acid residue) that contains salts including alkali metal ions such as lithium.

As a further example of other materials useful as the intermediate layer may be listed an insulator. The memory element of the invention can drastically improve its memory retention ability by a solution coating of such an insulating polymer as polystyrene and polyacrylate to a thickness of several tens to several hundreds nm order.

The memory element of the present invention is featured by the use of the radical polymer, a novel material that has never been used in this technical field in the past, for the memory layer, i.e. the switching layer. The radical polymer is a sort of the redox reagent in which both electrons and holes can be injected.

The foregoing second embodiment of the invention takes advantage of such electrochemically active properties of the radical polymer, proposing, as a basic structure, a bipolar cell configuration of a multilayer structure where the film composed of the material selected from any one of dielectric, electron or ion conductor and insulator is sandwiched between the switching layer, as the intermediate layer that separates the switching layer into two layers, or another bipolar cell configuration where the one of the switching layers thus separated by the intermediate layer is the redox layer.

When a voltage is applied thereto and electrons and holes are injected thereinto, the element is set to a low-resistivity state (i.e., ON state), while when an inverse voltage is applied thereto, then it returns to the original high-resistivity state (OFF state), thus allowing the reversible switching action to occur. In order for the memory element to be nonvolatile, self-discharge property needs to be low, and ON-state needs to last stably for long hours at an open-circuited potential. Such needs are met due to the intermediate layer preventing the recombination of electrons and holes. Generally, a high-dielectric film can isolate positive and negative charges in opposite sides thereof, respectively, and this property can be utilized for the intermediate layer.

As a modified example of the foregoing basic bipolar cell configuration, it is also possible to employ a monopolar cell configuration provided with only one switching layer, by omitting either one of the switching layers separated by the intermediate layer into the two layers or the redox layer. In such monopole cell, memory retention ability and/or drive stability are improved by arranging the intermediate layer composed of the high-dielectric material between the switching layer and the anode layer or the cathode layer.

In that case, the role of the intermediate layer is basically the same as that of the intermediate layer of the foregoing bipolar cell. That is to say, when one of the charges (specifically, holes) is injected into the radical polymer of the switching layer, then the charges (specially, negative charge of electron) which are generated on the anode layer or the cathode layer with the intermediate layer sandwiched therebetween are stored on the anode layer or between the cathode layer and the intermediate layer.

Further, in the case that the intermediate layer is omitted, an appropriate distance between radical sites may be set in the radical polymer of the switching layer. Under the voltage-applied state, hopping of electrons and holes between the radical sites may occur. Precise design of a molecular structure of the radical polymer so that such hopping may not occur at an open-circuited potential enables the memory retention ability to be improved.

In that case, although the cell is monopolar in structure, it is bipolar in a mode of performance, and both electron and hole are injected into the radical polymer of the switching layer. By designing so that hopping action of electron or hole may not occur between the radical sites, the memory retention ability is improved. In the meantime, in order to control the distance between the radical sites, a radical monomer may be copolymerized with a non-radical monomer (for example, styrene, methacrylate and so on).

Hereinafter, the present invention will be explained in more detail, through the following specific examples, which, however, are not intended to limit the invention, but various other modifications are possible.

EXAMPLE 1

FIG. 1 is a schematic view of a memory element having a three-layered structure according to Example 1 of the present invention, wherein numeral 10 designates a memory element comprising an anode layer 12, a hole injection transport layer 13, a switching layer 14, an electron injection transport layer 15, a cathode layer 16 which are stacked on a base 11 in sequence. Each of the layers 12, 13, 14, 15 and 16 has a thickness in a range of from 1 to 1000 nm. Examples of the base 11 may include glass, silica or the like.

Figure 2:
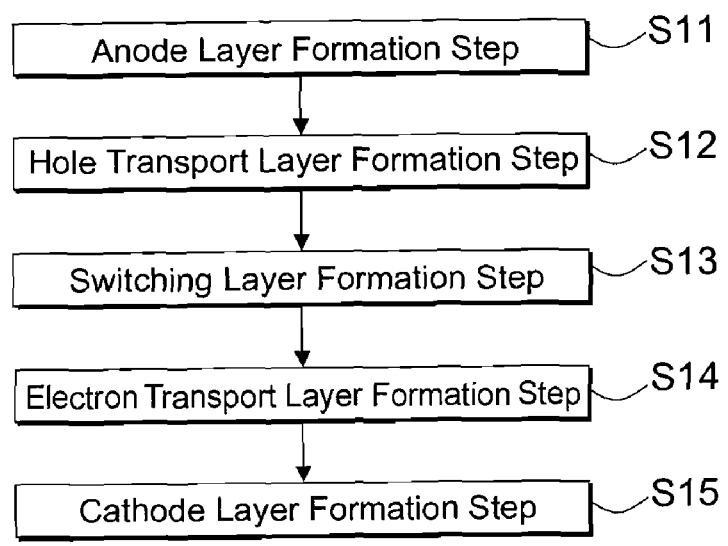
FIG. 2 is a flowchart showing a method for manufacturing the memory element in accordance with the same.

FIG. 2 shows a flowchart of the manufacturing process of a memory element 10. First, in Step S11 for forming the anode layer, the anode layer 12 is formed on the base 11. Then, in Step S12 for forming the hole injection transport layer, the hole injection transport layer 13 is formed on the anode layer 12 by a wet process. For example, after applying to the anode layer 12 a solution of the hole injection transport material for forming the hole injection transport layer, a thin film is formed by thermal vacuum drying.

Next, the switching layer 14 is formed on the hole injection transport layer 13 in Step S13 for forming switching layer. Specifically, after applying a solution of the radical polymer for forming the switching layer 14 to the hole injection transport layer 13, the switching layer 14 is formed by thermal vacuum drying processes. As for the radical polymer applied here, any suitable radical polymer may be chosen that is insoluble in a solvent used in applying the electron injection transport layer 15 onto the switching layer 14. As for the solvent of the radical polymer, any suitable one may be chosen that has low solubility relative to the hole injection transport material for forming the hole injection transport layer 13. Examples of the solvent of the radical polymer may include chloroform, THF, 1,2-dichloroethane or the like.

Then, in Step S14 for forming electron injection transport layer, the electron injection transport layer 15 is formed on the switching layer 14. Specifically, a solution of the electron injection transport material for forming the electron injection transport layer 15 is applied, and then subjected to heated-air drying under vacuum, thus forming a film of the electron injection transport layer 15 on the switching layer 14. As for the solvent of the electron injection transport material, any suitable one may be chosen that indicates low solubility relative to the radical polymer that constitutes the switching layer 14. For example, toluene, p-xylene or the like may be chosen.

Then, in Step S15 for forming cathode, the cathode layer 16 is formed on the electron injection transport layer 15. Although the method for forming the cathode layer 16 is not to be specifically limited, the cathode layer 16 may be formed by vacuum deposition, sputtering or the like, through a given mask as needed.

When applying and sweeping a voltage between the anode layer 12 and the cathode layer 16 of the memory element 10 manufactured as above, electrical conductivity rises up abruptly at a preset threshold voltage. Specifically, sweeping the potential from 0V to positive higher potentials, then the current value rises up abruptly (ten times or more) at the threshold voltage. In other words, the high-resistivity state is changed into the low-resistivity state at the threshold voltage, and the low-resistivity state is retained on a permanent basis until a reverse bias voltage is applied. Here, the term "positive bias" is a state of an electric potential in which the electric potential of an anode layer is higher than that of a cathode layer, while the term "reverse bias" is a state of an electric potential in which the electric potential of a cathode layer is higher than that of an anode layer.

The memory element 10 of the present invention shows a switching property. Here, the term "switching property" is a property showing change from a high-resistivity state to a low-resistivity state at a threshold voltage at the time of sweeping an applied voltage toward a positive bias again, after changing the element into the high-resistivity state (OFF-state) by sweeping the applied voltage toward a reverse bias against the element in the low-resistivity state.

As above, according to the memory element of the present example, the provision of the switching layer 14 composed of the insulating radical polymer between the anode layer 12 and the cathode layer 16 enables a novel nonvolatile memory element having a high on-off ratio to be produced, through the simple and high-yield process using the organic material.

Further, the on-off ratio can be improved due to the provision of the hole injection transport layer 13 between the foregoing switching layer 14 and the anode layer 12 as well as the electron injection transport layer 15 between the foregoing switching layer 14 and the cathode layer 16.

Also, the use of nitroxide radical polymer as the radical polymer enables the response characteristic to be made more prompt.

Still also, according to the method for manufacturing the memory element of the present example, the switching layer 14, the hole injection transport layer 13 and the electron injection transport layer 15 are formed on top of another by the wet process, and thus homogeneity in film quality between the respective layers 13, 14 and 15 can be ensured, so that the memory elements can be manufactured by the simple and high-yield process.

EXAMPLE 2

Figure 3:
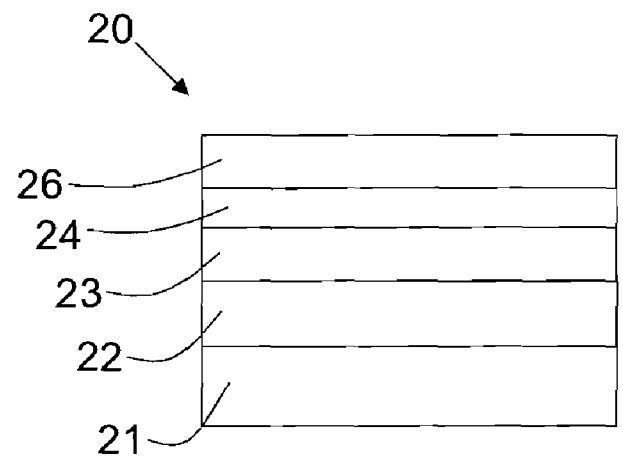
FIG. 3 is a schematic view showing a memory element in accordance with Example 2 of the present invention.

FIG. 3 shows a schematic diagram showing a memory element having a two-layered structure according to a second example of the present invention. Numeral 20 designates the memory element which has a laminated structure such that an anode layer 22, a hole injection transport layer 23, a switching layer 24 and a cathode layer 26 are stacked on the base 21 in sequence. Each of the layers 22, 23, 24 and 26 has a thickness ranging from 1 to 1000 nm.

Figure 4:
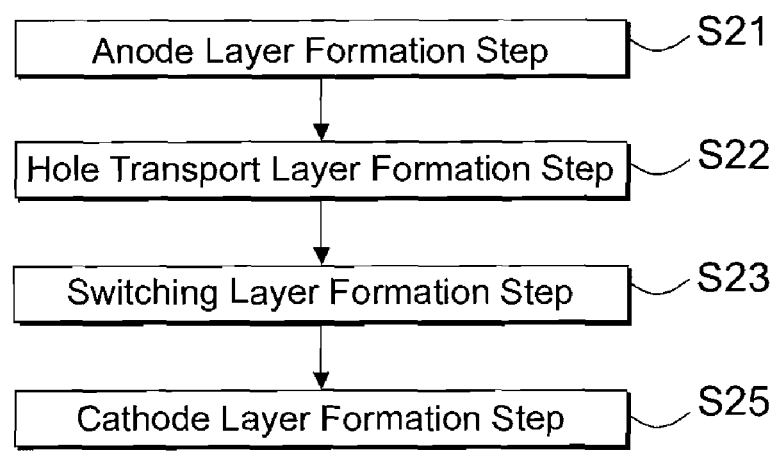
FIG. 4 is a flowchart showing a method for manufacturing the memory element in accordance with the Example 2.

FIG. 4 shows a flowchart of the manufacturing process of a memory element 20. First, in Step S21 for forming the anode layer, the anode layer 22 is formed on the base 21. Then, in Step S22 for forming the hole injection transport layer, the hole injection transport layer 23 is formed on the anode layer 22 by a wet process. For example, after applying to the anode layer 22 a solution of the hole injection transport material for forming the hole injection transport layer 23, it is subjected to thermal vacuum drying to thereby form a thin film. As for the hole injection transport material to be applied here, any suitable material may be chosen that is insoluble in a solvent used in applying the switching layer 24 onto the hole injection transport layer 23.

Next, the switching layer 24 is formed on the hole injection transport layer 23 in Step S23 for forming switching layer. Specifically, after applying a solution of the radical polymer for forming the switching layer 24 onto the hole injection transport layer 23, the switching layer 24 is formed by subjecting the same to thermal vacuum drying processes. As for the solvent of the radical polymer, any suitable one may be chosen that has low solubility relative to the hole injection transport material for forming the hole injection transport layer 23.

Then, in Step S25 for forming cathode, the cathode layer 26 is formed on the switching layer 24. Although the method for forming the cathode layer 26 is not to be specifically limited, the cathode layer 26 may be formed by vacuum deposition, sputtering or the like, through a given mask as needed.

When applying and sweeping a voltage between the anode layer 22 and the cathode layer 26 of the memory element 20 manufactured as above, electrical conductivity rises up abruptly at a preset threshold voltage. Specifically, sweeping the potential from 0V to positive higher potentials, then the current value rises up abruptly (ten times or more) at the threshold voltage. In other words, the high-resistivity state is changed into the low-resistivity state at the threshold voltage, and the low-resistivity state is retained on a permanent basis until a reverse bias voltage is applied.

As above, according to the memory element of the present example, the provision of the switching layer 24 composed of the insulating radical polymer between the anode layer 22 and the cathode layer 26 enables a novel nonvolatile memory element having a high on-off ratio to be produced, through the simple and high-yield process using the organic material.

Further, the on-off ratio can be improved due to the provision of the hole injection transport layer 23 between the foregoing switching layer 24 and the anode layer 22.

EXAMPLE 3

Figure 5:
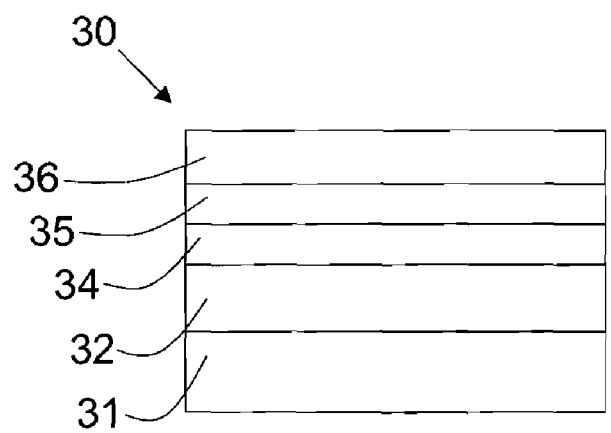
FIG. 5 is a schematic view showing a memory element in accordance with Example 3 of the present invention.

FIG. 5 shows a schematic diagram showing a memory element having a two-layered structure according to a third example of the present invention. Numeral 30 designates the memory element, comprising a laminated structure such that an anode layer 32, a switching layer 34, an electron transport layer 35 and a cathode layer 36 are stacked on a base 31 in sequence. Each of the layers 32, 34, 35 and 36 has a thickness ranging from 1 to 1000 nm.

Figure 6:
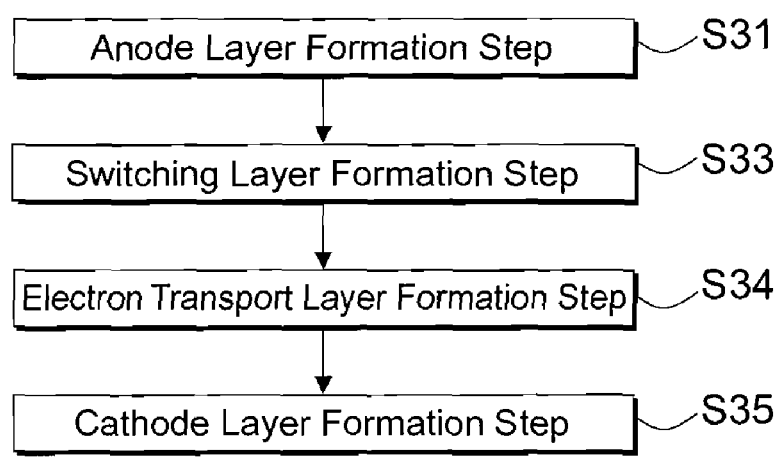
FIG. 6 is a flowchart showing a method for manufacturing the memory element in accordance with Example 3.

FIG. 6 shows a flowchart of the manufacturing process of a memory element 30. First, in Step S31 for forming the anode layer, the anode layer 32 is formed on the base 31. Then, in Step S33 for forming the switching layer, the switching layer 34 is formed on the anode layer 32 by a wet process. Specifically, after applying to the anode layer 32 a solution of the radical polymer for forming the switching layer 34, it is subjected to thermal vacuum drying to thereby form a film of the switching layer 34. As for the radical polymer to be applied here, any suitable one may be chosen that is insoluble in a solvent used in applying the electron injection transport layer 35 onto the switching layer 34.

Next, the electron injection transport layer 35 is formed on the switching layer 34 in Step S34 for forming electron injection transport layer. Specifically, after applying a solution of the electron injection transport material for forming the electron injection transport layer 35, it is subjected to heated-air drying process under vacuum condition, and thus the electron injection transport layer 35 is formed on the switching layer 34. As for the solvent of the electron injection transport material, any suitable one may be chosen that indicates low solubility relative to the radical polymer that constitutes the switching layer 34.

Then, in Step S35 for forming cathode, the cathode layer 36 is formed on the electron injection transport layer 35. Although the method for forming the cathode layer 36 is not to be specifically limited, the cathode layer 36 may be formed by vacuum deposition, sputtering or the like, through a given mask as needed.

When applying and sweeping a voltage between the anode layer 32 and the cathode layer 36 of the memory element 30 manufactured as above, electrical conductivity rises up abruptly at a preset threshold voltage. Specifically, sweeping the potential from 0V to positive higher potentials, then the current value rises up abruptly (ten times or more) at the threshold voltage. In other words, the high-resistivity state is changed into the low-resistivity state at the threshold voltage, and the low-resistivity state is retained on a permanent basis until a reverse bias voltage is applied.

As above, according to the memory element of the present example, the provision of the switching layer 34 composed of the insulating radical polymer between the anode layer 32 and the cathode layer 36 enables a novel nonvolatile memory element having a high on-off ratio to be produced, through the simple and high-yield process using the organic material.

Further, the on-off ratio can be improved due to the provision of the electron injection transport layer 35 between the foregoing switching layer 34 and the anode layer 36.

EXAMPLE 4

Figure 7:
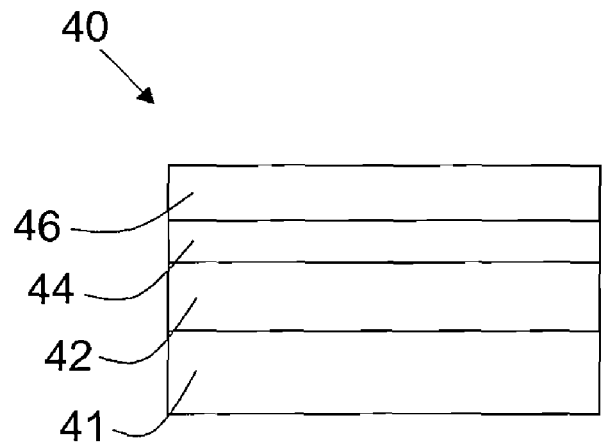
FIG. 7 is a schematic view showing a memory element in accordance with Example 4 of the present invention.

FIG. 7 shows a schematic diagram showing a memory element having a single-layer structure according to a fourth example of the present invention. Numeral 40 designates the memory element, comprising a laminated structure such that an anode layer 42, a switching layer 44 and a cathode layer 46 are stacked on a base 41 in sequence. Each of the layers 42, 44 and 46 has a thickness ranging from 1 to 1000 nm.

Figure 8:
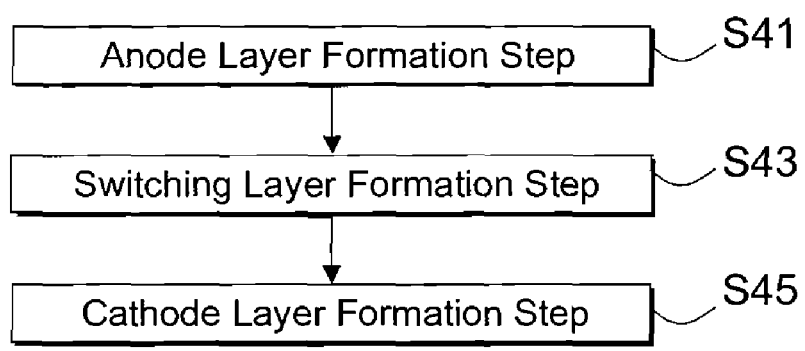
FIG. 8 is a flowchart showing a method for manufacturing the memory element in accordance with Example 4.

FIG. 8 shows a flowchart of the manufacturing process of a memory element 40. When manufacturing the memory element 40, first, in Step S41 for forming the anode layer, the anode layer 42 is formed on the base 41. Then, in Step S43 for forming the switching layer, the switching layer 34 is formed on the anode layer 42. Specifically, a solution of the radical polymer for forming the switching layer 44 is applied to the anode layer 42, which is then subjected to thermal vacuum drying process to thereby form a film of the switching layer 44.

Then, in Step S45 for forming cathode, the cathode layer 46 is formed on the switching layer 44. Although the method for forming the cathode layer 46 is not to be specifically limited, the cathode layer 46 may be formed by vacuum deposition, sputtering or the like, through a given mask as needed.

When applying and sweeping a voltage between the anode layer 42 and the cathode layer 46 of the memory element 40 manufactured as above, electrical conductivity rises up abruptly at a preset threshold voltage. Specifically, sweeping the potential from OV to positive higher potentials, then the current value rises up abruptly (ten times or more) at the threshold voltage. In other words, the high-resistivity state is changed into the low-resistivity state at the threshold voltage, and the low-resistivity state is retained on a permanent basis until a reverse bias voltage is applied.

As above, according to the memory element of the present example, the provision of the switching layer 44 composed of the insulating radical polymer between the anode layer 42 and the cathode layer 46 enables a novel nonvolatile memory element having a high on-off ratio to be produced, through the simple and high-yield process using the organic material.

EXAMPLE 5

Manufacture of the Memory Element 20 Having a Two-Layered Structure

A base (25×25×1 mm, made by Asahi Glass Co., Ltd.) with an ITO layer (150 nm) formed on the glass base beforehand was placed on a spin coater. After spin coating the base with PEDOT:PSS solution (made by Bayer Material Science AG, trade name: BAYTRON P) at 1200 rps for 60 seconds, it was dried at 120 degrees C. under vacuum condition for 1.5 hours, so that the thin film of PEDOT:PSS of 40 nm thickness was formed on the base. Then, 5 g/L of chloroform solution of poly (2,2,6,6-tetramethylpiperidinyloxy methacrylate) (PTMA) was applied thereto by spin coating at 1000 rps for 60 seconds, and then subjected to drying at 50 deg C. for an hour under vacuum condition, so that a thin film of PTMA was formed to a 30 nm thickness on the base. Subsequently, the base that was formed with the above-mentioned ITO/PTMA structure was placed in a base holder within a chamber of a vacuum deposition system. To the electrodes in the chamber were fitted filaments wrapped by Al. Thereafter, the pressure in the chamber was reduced, and aluminum serving as the cathode was deposited on the base to a thickness of 1200 nm at a degree of vacuum ranging from 1 to $3 \times 10^{-5}$ Pa at deposition speed of 5-7 Å/sec. After the deposition, the pressure inside the chamber was returned to atmospheric pressure, and the base was taken out. In this way, the memory element 20 having a two-layered laminated structure of ITO (150 nm)/PEDOT:PSS (40 nm)/PTMA (30 nm)/AL (120 nm) was manufactured on the glass base.

<Current-Voltage Characteristic>

Figure 9:
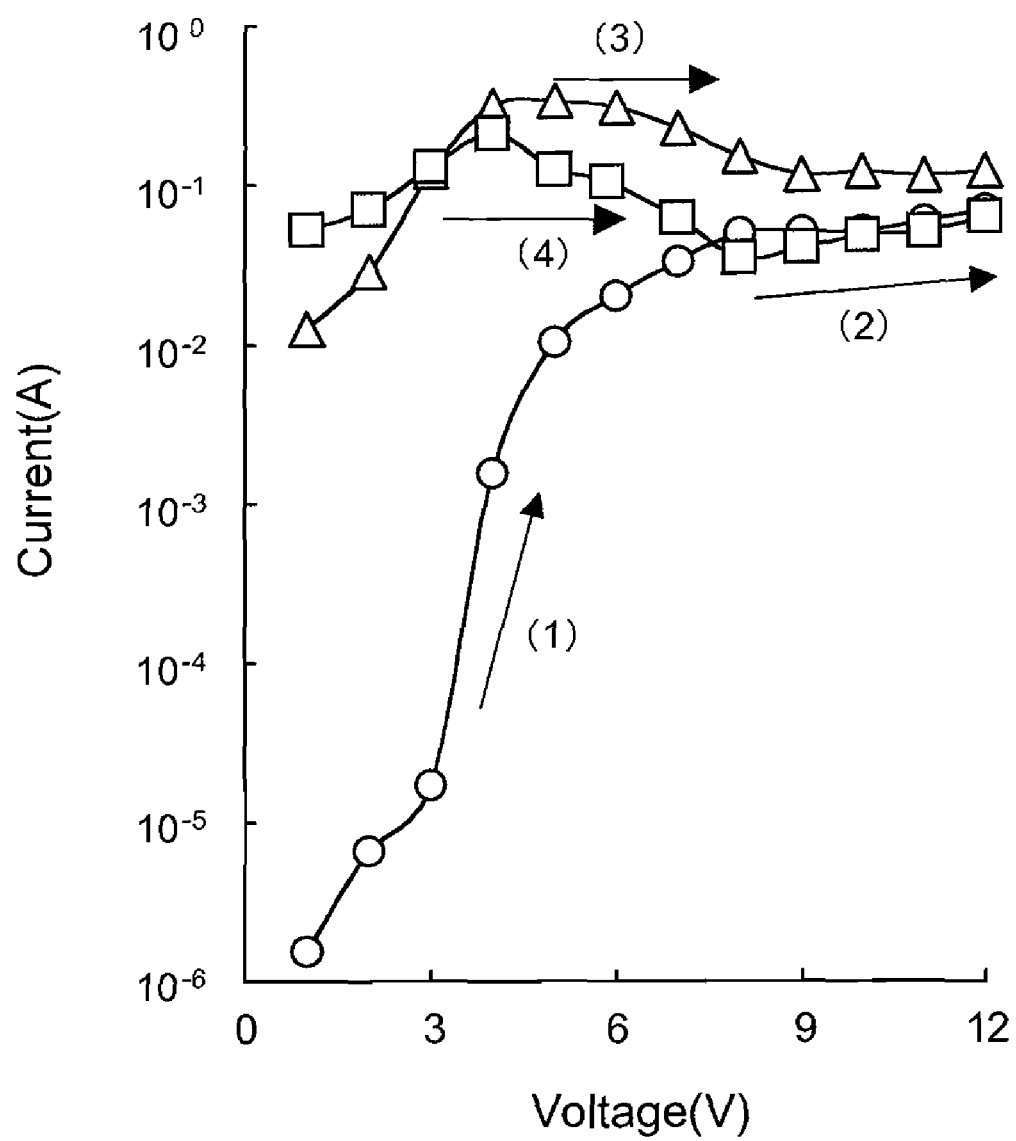
FIG. 9 is a current-voltage characteristic curve of a memory element in accordance with Example 5 of the present invention.

For the memory element 20 manufactured as above, measurement of current and voltage was carried out, with the ITO of the memory element serving as an anode, while Al thereof serving as a cathode, using a digital source meter (2400-C Source Meter, made by KEITHLEY INSTRUMENTS INC. Specifically, while allowing a voltage applied between the electrodes of the memory element to rise in increments of 1.0V within a range of from 0 to 20V, electric current flowing through the memory element during that period was measured, so that the current-voltage characteristic curve as shown in FIG. 9 was obtained, which shows that threshold voltage was 3-5 V, and the current value was in the high-resistivity state of $10^{-5}$ A when the positive bias applied voltage was 3V or below. When the positive bias voltage reached 5V, however, current value rose up to $10^{-2}$ A, i.e., $10^3$ times the previous value, and changed into the low-resistivity state (see arrow (1)). When 5V or higher voltage was applied, the same low-resistivity state was retained (see arrow (2)). Subsequently, when the positive bias voltage was applied again, the low-resistivity state was still retained (see arrow (3)), thus demonstrating that the low-resistivity state is retained even though the positive bias voltage is applied repeatedly (see arrow (4)), that is to say, the memory property of the element being retained.

EXAMPLE 6

Manufacture of the Memory Element 20 Having Two-Layered Structure-2

The memory element was manufactured in the same way as in Example 5 except that the thickness of PTMA film was changed from 30 nm to 10 nm. The PTMA film of 30 nm thickness was formed by spin-coating the base with 5 g/L of chloroform solution of PTMA at 4000 rps for 60 seconds, and then drying it for 1.0 hour at 50 deg C. under vacuum condition.

<Current-Voltage Characteristic>

Figure 10:
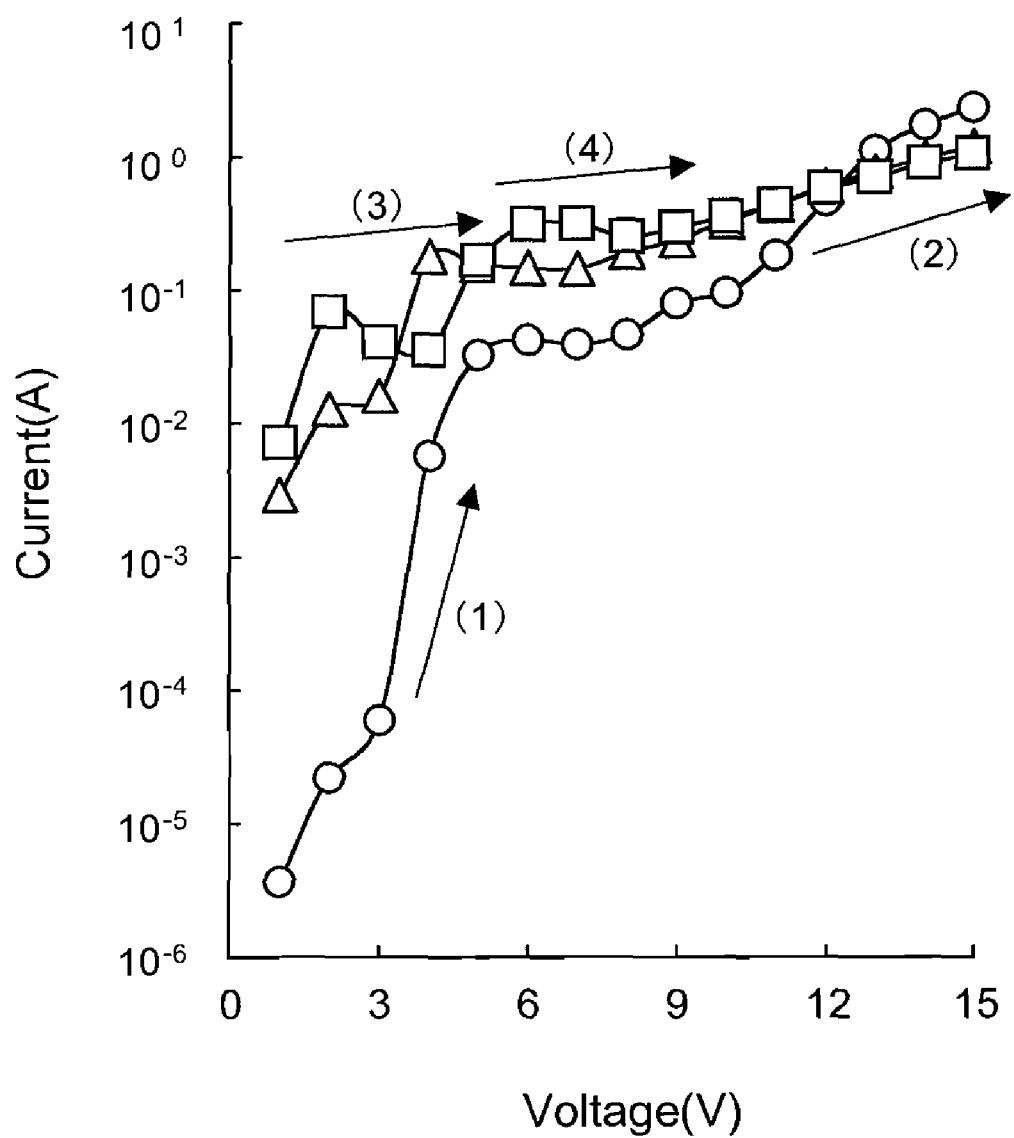
FIG. 10 is a current-voltage characteristic curve of a memory element in accordance with Example 6 of the present invention.

While raising the voltage applied between the electrodes of the manufactured memory element 20 in increments of 1.0V within a range from 0 to 20 V, current and voltage were measured in the same way as in Example 5, and thus the current-voltage characteristic curves were obtained as shown in FIG. 10, which shows that threshold voltage was 3-5 V, and the current value was in the high-resistivity state of $10^{-4}$ A when the positive bias applied voltage was 3V. When the positive bias voltage reached 5V, however, current value rose up to $10^{-1}$ A, i.e., $10^3$ times the previous value, and changed into the low-resistivity state (see arrow (1)). When 5V or higher voltage was applied, the same low-resistivity state was retained (see arrow (2)). Subsequently, when the positive bias voltage was applied again, the low-resistivity state was still retained (see arrow (3)), thus demonstrating that the low-resistivity state is retained even though the positive bias voltage is applied repeatedly (see arrow (4)), that is to say, the memory property of the element being retained.

EXAMPLE 7

Manufacture of the Memory Element 30 Having Two-Layered Structure

Like in Example 6, PTMA film of 10 nm thickness was formed on the base by spin-coating method. A MEH-PPV film of 25 nm thickness was formed on the base by spin-coating the base with 17 g/L of toluene solution of MEH-PPV at 1000 rps for 3 seconds, and then drying it for 1.5 hour at 120 deg C. under vacuum. Finally, as a cathode, Al was formed in the same way as in Example 5. As above, the memory element 30 having a two-layered structure of ITO (150 nm)/PTMA (10 nm)/MEH-PPV (25 nm)/Al (120 nm) was manufactured on the glass base.

<Current-Voltage Characteristic>

Figure 11:
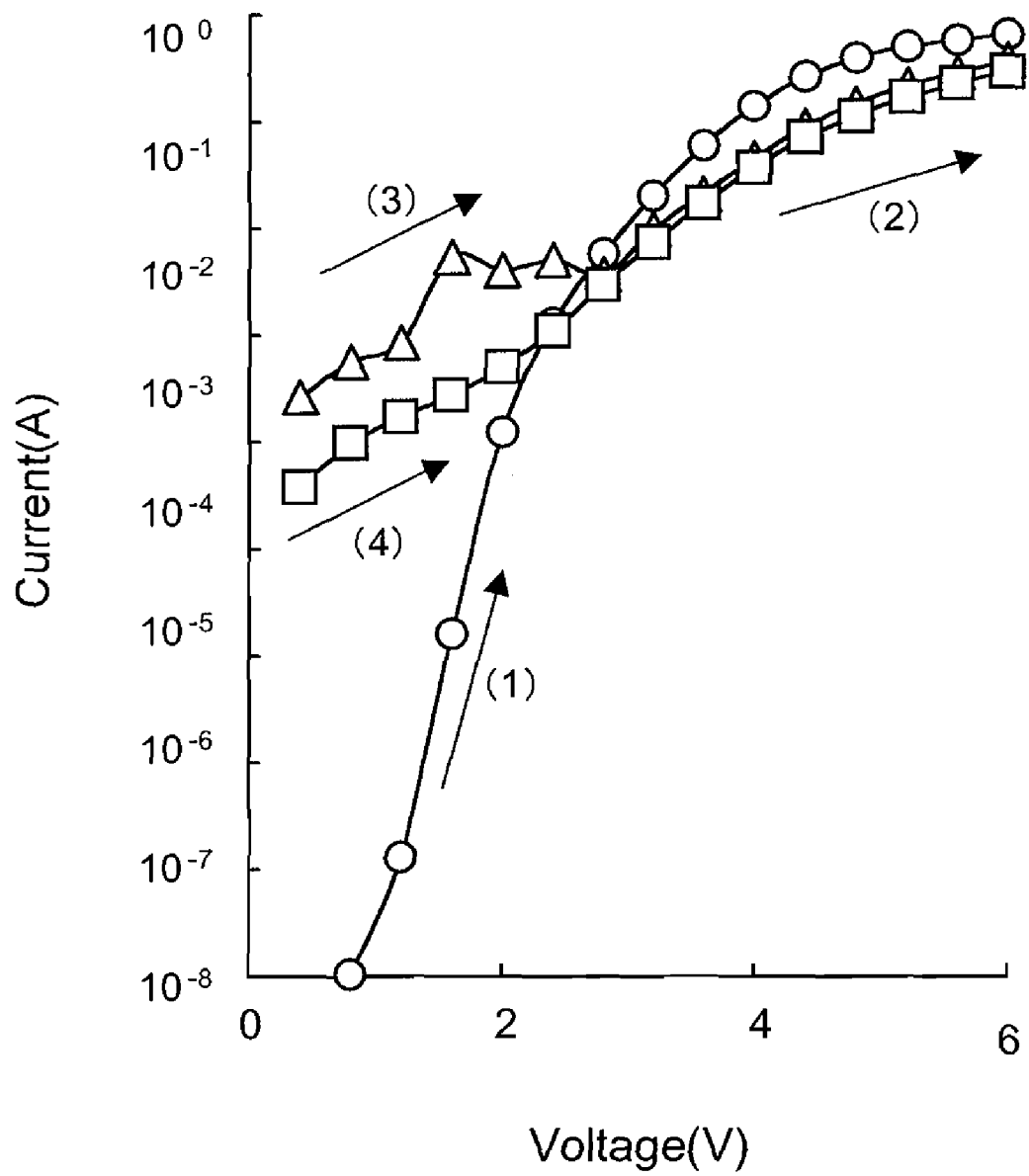
FIG. 11 is a current-voltage characteristic curve of a memory element in accordance with Example 7 of the present invention.

While raising the voltage applied between the electrodes of the manufactured memory element 30 in increments of 0.4V within a range from 0 to 8 V, current and voltage were measured in the same way as in Example 5, and thus the current-voltage characteristic curves were obtained as shown in FIG. 11, which shows that threshold voltage was 1-2 V, and the current value was in the high-resistivity state of $10^{-7}$ A when the positive bias applied voltage was 1V. When the positive bias voltage was raised up to 2V, current value rose up to $10^{-3}$ A, i.e., $10^4$ times the previous value, and changed into the low-resistivity state (see arrow (1)). When 2V or higher voltage was applied, the same low-resistivity state was retained (see arrow (2)). Subsequently, when the positive bias voltage was applied again, the low-resistivity state was still retained (see arrow (3)), thus demonstrating that the low-resistivity state is retained even though the positive bias voltage is applied repeatedly (see arrow (4)), that is to say, the memory property of the element being retained.

EXAMPLE 8

Manufacture of the Single-Layered Memory Element 40

Like in Example 6, PTMA film of 10 nm thickness was formed on the base by spin-coating method. Further, Al of the cathode was formed in the same way as in Example 5. Thus, the single-layered memory element 40 of ITO (150) nm/PTMA (10 nm)/Al (120 nm)) was formed on the glass base.

<Current-Voltage Characteristic>

While raising the voltage applied between the electrodes of the manufactured memory element in increments of 0.5V within a range from 0 to 10 V, current and voltage were measured in the same way as in Example 5, and thus the current-voltage characteristic curves were obtained like in FIGS. 9 to 11. Threshold voltage was 5-6 V, and the current value was in the high-resistivity state of $10^{-1}$ A when the positive bias applied voltage was 5V or below. When the positive bias voltage reached 6V, however, current value rose up to $10^0$ A, i.e., $10^1$ times the previous value, and changed into the low-resistivity state. When 6V or higher voltage was applied, the same low-resistivity state was retained. Subsequently, when the positive bias voltage was applied again, the low-resistivity state was still retained, thus demonstrating that the low-resistivity state is retained even though the positive bias voltage is applied repeatedly, that is to say, the memory property of the element being retained.

EXAMPLE 9

Manufacture of the Memory Element 10 Having Three-Layered Structure

Like in Example 6, PEDOT:PSS (40 nm) and PTMA (10 nm) were stacked on the base. Further, like in Example 7, MEH-PPV film of 25 nm thickness was formed on the base, and finally Al of the cathode was formed in the same way as in Example 5. Thus, the memory element 10 having three-layered structure of ITO (150 nm)/PEDOT:PSS (35 nm)/PTMA (10 nm)/MEH-PPV (25 nm)/Al (120 nm) was manufactured.

<Current-Voltage Characteristic>

Figure 12:
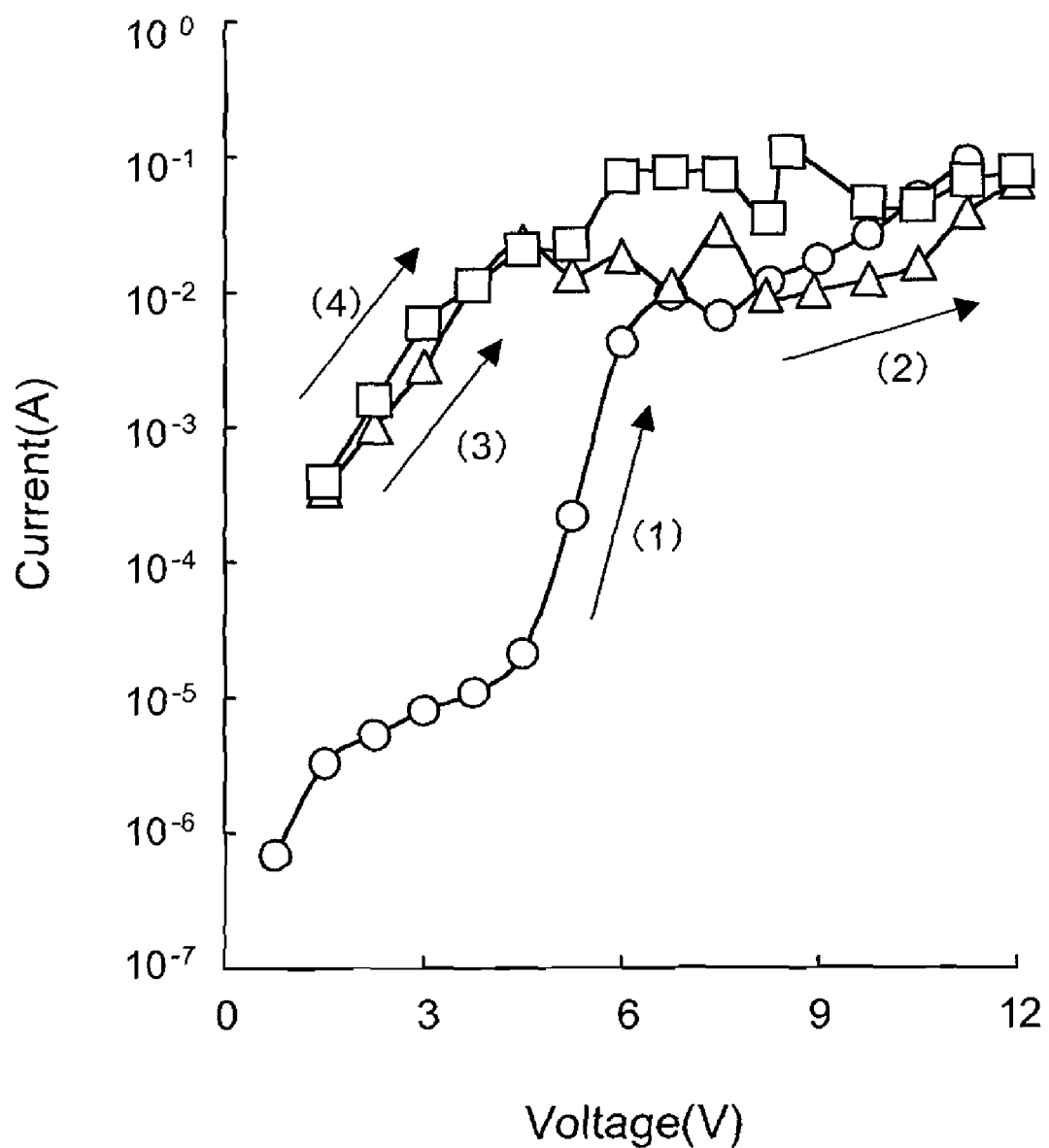
FIG. 12 is a current-voltage characteristic curve of a memory element in accordance with Example 9 of the present invention.

While raising the voltage applied between the electrodes of the manufactured memory element 10 in increments of 0.75V within a range from 0 to 15 V, current and voltage were measured in the same way as in Example 5, and thus the current-voltage characteristic curves were obtained as shown in FIG. 12, which shows that threshold voltage was 4-6 V, and the current value was in the high-resistivity state of $10^{-5}$ A when the positive bias applied voltage was 4V. When the positive bias voltage reached 6V, however, current value rose up to $10^{-2}$ A, i.e., $10^3$ times the previous value, and changed into the low-resistivity state (see arrow (1)). When 6V or higher voltage was applied, the same low-resistivity state was retained (see arrow (2)). Subsequently, when the positive bias voltage was applied again, the low-resistivity state was still retained (see arrow (3)), thus demonstrating that the low-resistivity state is retained even though the positive bias voltage is applied repeatedly (see arrow (4)), that is to say, the memory property of the element being retained.

EXAMPLE 10

Manufacture of the Memory Element 10 Having Three-Layered Structure-2

Except that the thickness of the PTMA film was changed from 10 nm to 20 nm, the memory element 10 was formed in the same way as in Example 9. PTMA film of 20 nm thickness was formed by spin-coating the base with 5 g/L of chloroform solution of PTMA at 2000 rps for 60 seconds, and then drying it for 1.0 hour at 50 deg C. under vacuum.

<Current-Voltage Characteristic>

Figure 13:
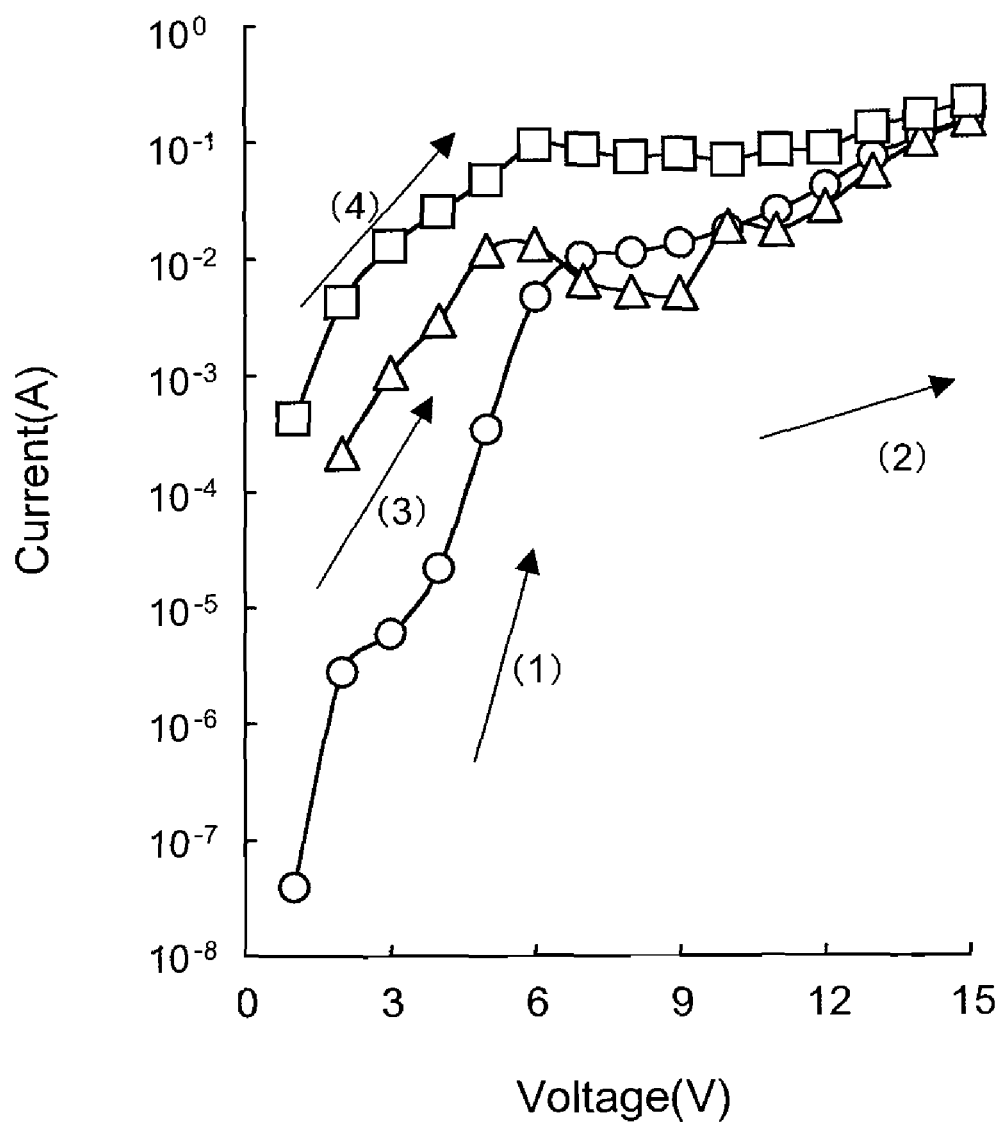
FIG. 13 is a current-voltage characteristic curve of a memory element in accordance with Example 10 of the present invention.

While raising the voltage applied between the electrodes of the manufactured memory element 10 in increments of 1.0V within a range from 0 to 20 V, current and voltage were measured in the same way as in Example 5, and thus the current-voltage characteristic curves were obtained as shown in FIG. 13, which shows that threshold voltage was 3-6 V, and the current value was in the high-resistivity state of $10^{-5}$ A when the positive bias applied voltage was 3V When the positive bias voltage reached 6V, however, current value rose up to $10^{-2}$ A, i.e., 103 times the previous value, and changed into the low-resistivity state (see arrow (1)). When 6V or higher voltage was applied, the same low-resistivity state was retained (see arrow (2)). Subsequently, when the positive bias voltage was applied again, the low-resistivity state was still retained (see arrow (3)), thus demonstrating that the low-resistivity state is retained even though the positive bias voltage is applied repeatedly (see arrow (4)), that is to say, the memory property of the element being retained.

Figure 14:
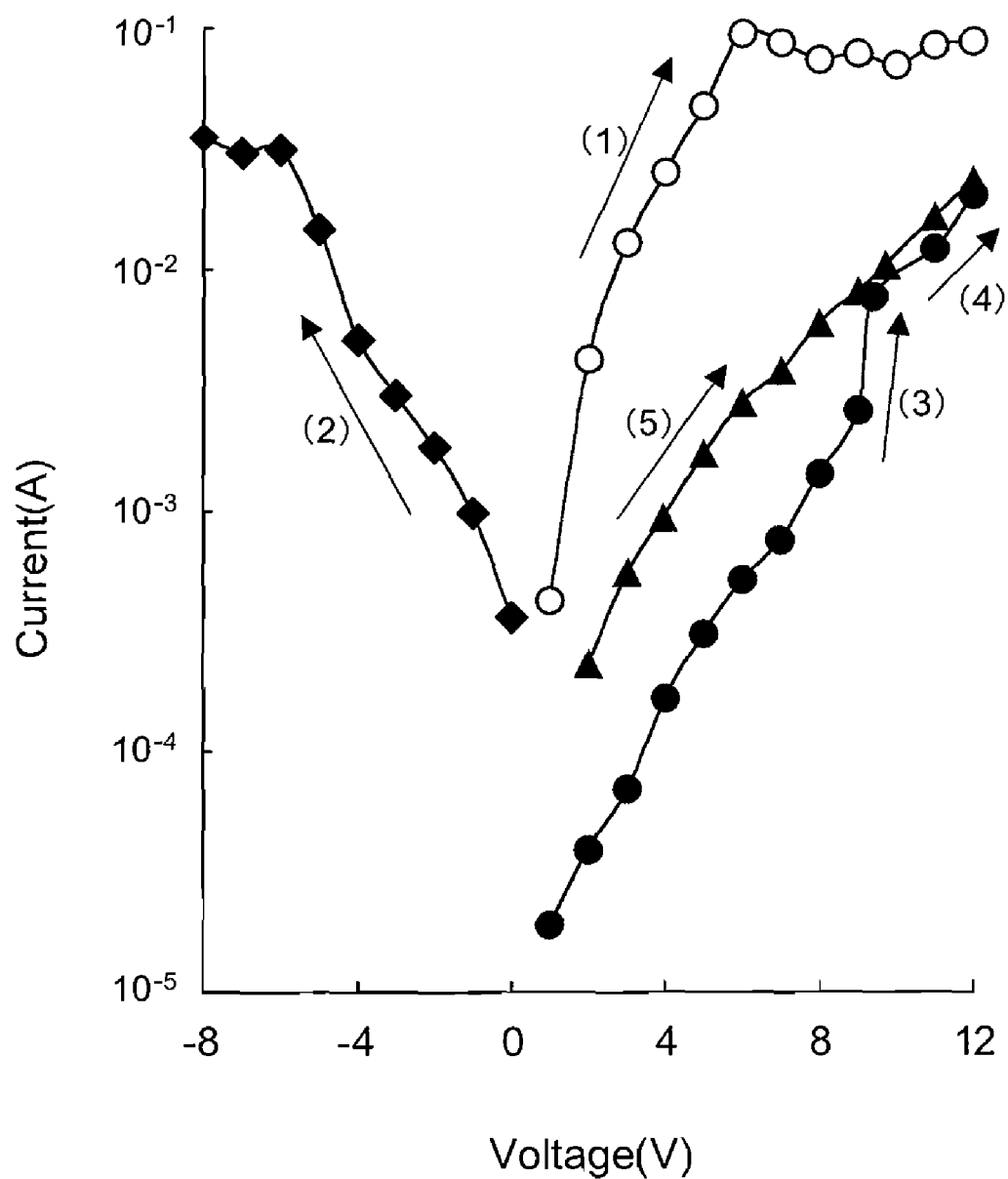
FIG. 14 is a current-voltage characteristic curve of the memory element when reverse-bias voltage is applied in accordance with the same.

Further, when the reverse-bias voltage was applied, the switching property was indicated although the on-off ratio was not high, and current-voltage characteristic curves shown in FIG. 14 were obtained. Specifically, when once the high-resistivity state was changed to the low-resistivity state by applying the positive bias voltage, and then, the positive bias voltage was applied again, the low-resistivity state was retained (see arrow (1)). Subsequently, the reverse bias voltage was applied (arrow (2)), and then the positive bias voltage was applied. As a result, when the applied voltage was at 8V, the current value was returned to the high-resistivity state of $10^{-3}$ A, and the memory in the low-resistivity state was erased. When the positive bias voltage was at 10V, the current value rose up to $10^{-2}$ A, i.e., 101 times the previous value, and changed in the low-resistivity state (arrow (3)). When the applied voltage was 10V or more, the low-resistivity state was retained (arrow (4)). Subsequently, when the positive bias voltage was applied again, the low-resistivity state was retained (arrow (5)), so that the switching characteristic was demonstrated.

EXAMPLE 11

Manufacture of the Memory Element 10 Having Two-Layered Structure-3

Except that the thickness of the PTMA film was changed from 10 nm to 30 nm, the memory element 10 was formed in the same way as in Example 9. PTMA film of 30 nm thickness was formed in the same way as in Example 5.

<Current-Voltage Characteristic>

While raising the voltage applied between the electrodes of the manufactured memory element 10 in increments of 0.6V within a range from 0 to 12 V, current and voltage were measured in the same way as in Example 5, and thus the current-voltage characteristic curves were obtained like as shown in FIG. 13 obtained from the memory element 10 manufactured in Example 10. Threshold voltage was 3-5 V, and the current value was in the high-resistivity state of $10^{-4}$ A when the positive bias applied voltage was 6V. When the positive bias voltage reached 8V, however, current value rose up to $10^{-2}$ A, i.e., 102 times the previous value, and changed into the low-resistivity state. When 8V or higher voltage was applied, the same low-resistivity state was retained. Subsequently, when the positive bias voltage was applied again, the low-resistivity state was still retained, thus demonstrating that the low-resistivity state is retained even though the positive bias voltage is applied repeatedly, that is to say, the memory property of the element being retained.

<Evaluation>

The memory elements of Examples 5 to 11 according to the first embodiment of the present invention were manufactured, using the insulating radical polymer, simply by the wet process, while the homogeneity of the film qualities being retained, and showed excellent switching properties. Whilst Example 8 was directed to the PTMA single-layered memory element, the on-off ratio of the memory was improved drastically from $10^1$ times to $10^4$ times at maximum, by stacking PEDOT:PSS and/or MEH-PPV as the electron injection transport polymer on PTMA, as in Examples 5 to 7 and 9 to 11. Further, as shown in Example 10, the switching characteristic also was indicated by the formation of the three-layered structure.

EXAMPLE 12

Synthesis of PTMA Homopolymer

Chemical formula 4

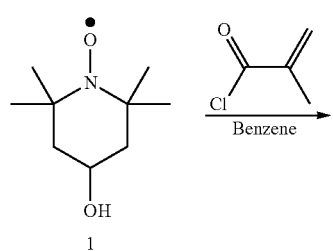

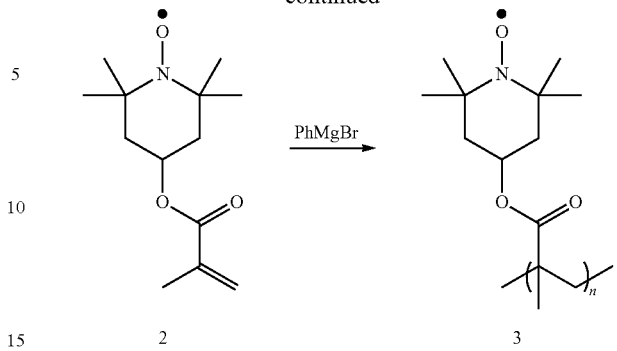

According to the scheme (1) shown in the above chemical formula 4, PTMA homopolymer was synthesized. That is to say, after synthesizing a monomer (2) using reaction of 2,2, 6,6-tetramethyl-4-hydroxypiperidine-1-oxyl (1) with methacrylate chloride, PTMA (3), as a homopolymer of the monomer (2), was obtained as a red powder through the anionic polymerization, using phenyl magnesium bromide as polymerization initiator. The molecular weight of the obtained PTMA was Mn=21,000 (Mw/Mn=1.2). And it was soluble in organic solvents such as THF, chloroform, ethyl lactate or the like. In the measurement of ESR, single-peaked spectrum was shown at around g=2.00, and thus it was confirmed that the radical had been introduced quantitatively as expected.

EXAMPLE 13

Synthesis of CoPTMA Copolymer

The mixture of the monomer (2) synthesized by the method of Example 12 and methyl methacrylate (hereinafter referred to as MMA) as mixed in molar ratio of 30:70 was polymerized, using phenyl magnesium bromide as polymerization initiator. The molecular weight of the obtained CoPTMA was Mn=19,000 (Mw/Mn=1.3). Solubility and other properties were basically the same as PTMA homopolymer.

EXAMPLE 14

Manufacture of Memory Element Including the Intermediate Layer Composed of High-Dielectric Material The memory element of the present Example has a laminated structure of Al/PTMA/CR-V/PTMA/Al having aluminum electrodes. In other words, it was of the structure comprising anode layer/switching layer/intermediate layer/switching layer/cathode layer.

Here, the radical polymer used as the switching layer was PTMA homopolymer, which was dissolved into ethyl lactate, and then a thin film was formed on the aluminum base to a 100 nm thickness by spin-coating method. For the aluminum of the base serving as the anode layer was used the one obtained by being deposited on the ITO electrode to a 150 nm thickness under vacuum condition, and then subjected to surface oxidation treatment, using UV/ozone cleaner equipment. For the intermediate layer was used cyanoethyl polyvinyl alcohol made by Shin-Etsu Chemical Co. Ltd. (trade name: CR-V; relative permittivity is about 20 at room temperature), which was dissolved in acetonitrile, and using the resultant solution, the intermediate layer was stacked on the PTMA layer prepared beforehand, so as to have a film thickness of 50 nm, by spin coating method. Further, PTMA, serving as the switching layer, was formed on the CR-V layer to a 100 nm thickness, and then the upper aluminum electrode serving as the cathode layer, was deposited.

<Current-Voltage Characteristic>

Figure 15:
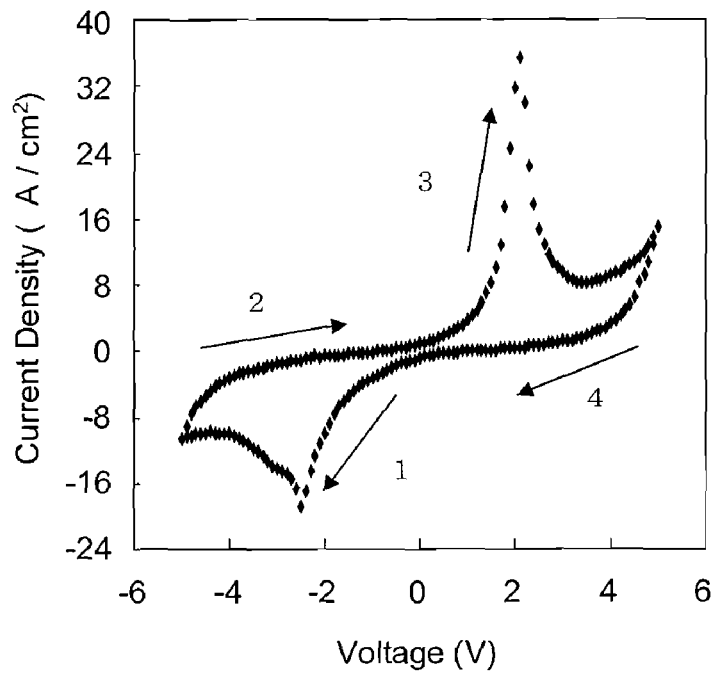
FIG. 15 is a current-voltage characteristic curve of a memory element in accordance with Example 14 of the present invention.

Current-voltage characteristic of the memory element thus obtained is shown in FIG. 15. When the upper aluminum electrode was polarized toward the negative side against the lower aluminum electrode, the memory element changed from the high-resistivity state ("OFF" state) into the low-resistivity state ("ON" state). Then, after the ON-state was retained by changing applied voltage toward the positive side, the memory element was switched to the OFF-state at a threshold value around 3V. When a voltage is applied toward the negative side again, then the memory element was switched to the ON-state again. As above, it was confirmed that the above-structured memory element enables memory retention and erasing to be performed reversibly.

After it was switched to the ON-state at the application of −4V, ON current value was read out at +2V, and the change in characteristics with time was examined. Here, if initial current value is 100, and OFF current value is zero, then a retention time is defined as time taken for the initial current value to attenuate by 50%, which was used as a measure of the memory retention property. As a result, the retention time of the memory element used here was about 180 seconds.

EXAMPLE 15

Manufacture of the Memory Element Including the Intermediate Layer Composed of Electrically Conductive Material The memory element of the present Example has a laminated structure of Al/PTMA/Al/PTMA/Al having Al electrodes. This Example is the same as Example 14 except that deposited aluminum layer of 30 nm film thickness was used as the intermediate layer.

<Current-Voltage Characteristic>

Figure 16:
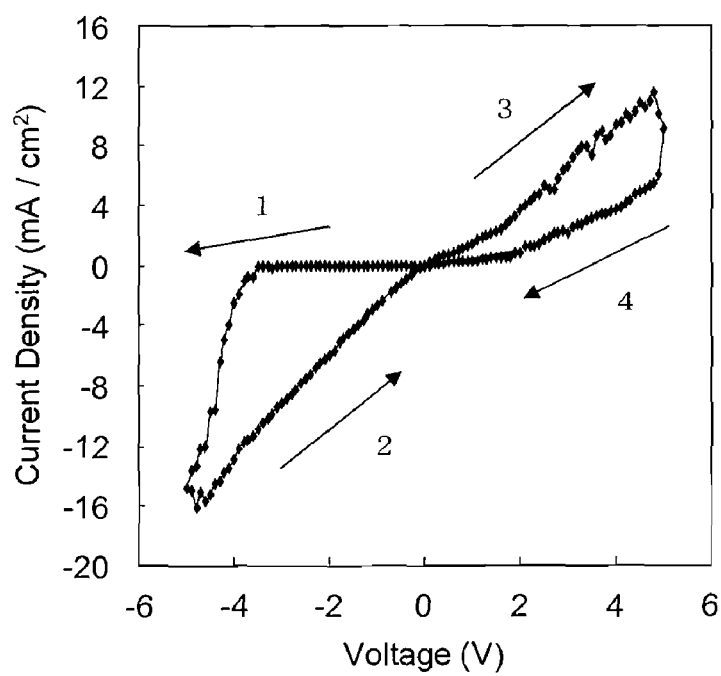
FIG. 16 is a current-voltage characteristic curve of a memory element in accordance with Example 15 of the present invention.

Current-voltage characteristic of the memory element thus obtained was shown in FIG. 16. When the upper electrode was polarized toward the negative side against the lower electrode, hardly any current flowed until around −4V (OFF-state), but thereafter it rose to ON-state. When the voltage was being shifted from −4V to +5V, the current value varied almost linearly in response to the change of the voltage. Then, when the voltage was lowered, voltage-current curve drew a hysteresis curve and shifted to OFF-state.

When the ratio of ON current to OFF current (on-off ratio) was observed with the readout voltage being set at +5V, the value was remarkably great, in the order of $10^3$ or above. Further, when the change of the ON current with time was examined, the initial current value decayed only about 2% for 600 seconds at the initial stage. In other words, the retention time of the element was as long as at least several hours or above, therefore, its memory retention property was remarkably good.

EXAMPLE 16

Manufacture of the Memory Element Including the Ionic Conductive Intermediate Layer The memory element of the present Example has a laminated structure of Al/PEDOT/PMMA+LiClO$_4$/PTMA/Al. In other words, it was of the structure comprising anode layer/redox layer/intermediate layer/switching layer/cathode layer, or otherwise, cathode layer/redox layer/intermediate layer/switching layer/anode layer.

For the intermediate layer was used an ionic conductive material obtained by adding 1 wt % of lithium perchlorate to a homopolymer of methyl methacrylate (PMMA; molar weight: 15,000). For the redox layer to be deposited on the aluminum base serving as the anode layer, was used Poly(3, 4-ethylenedioxythiophene) poly(styrenesulfonate) complex (trade name: Baytron PEDOT), of which the film was formed to a 100 nm thickness by spin coating method, and then lithium perchlorate dispersion PMMA, serving as the intermediate layer, was formed thereon to have a 30 thickness by using the spin coating method again. Further, PTMA as the switching layer and the Al layer as the cathode layer were stacked thereon in the same way as in Example 14, and thus the memory element was manufactured.

<Current-Voltage Characteristic>

Figure 17:
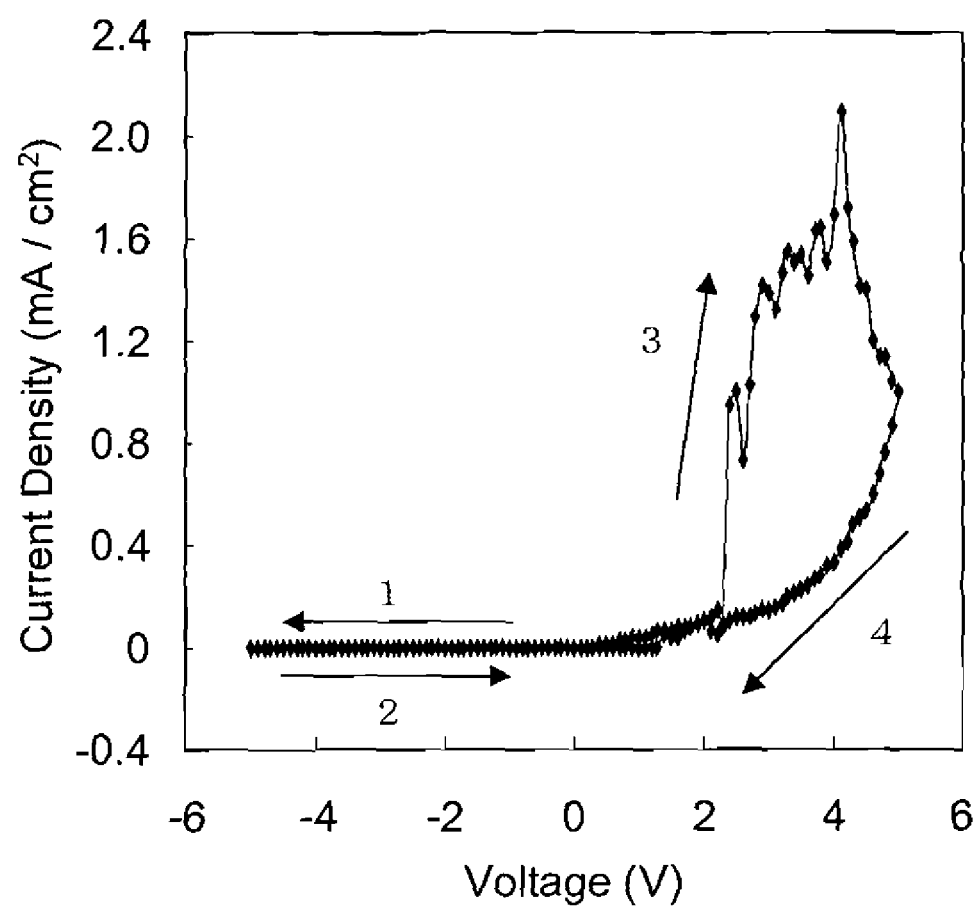
FIG. 17 is a current-voltage characteristic curve of a memory element in accordance with Example 16 of the present invention.

Current-voltage characteristic of the memory element thus obtained is shown in FIG. 17. Hardly any current flowed by applying a negative voltage in the initial state. However, when the electric potential was shifted toward the positive side later, switching from OFF-state to ON-state was observed at around +1.5V.

When the memory retention property thereof was examined from the temporal change of the initial current value in the ON-state, it was conformed that its on-off ratio was in the order of $10^3$ or above, and its retention time was as long as at least several hours or longer, having extremely good memory retention property, as was shown in Example 15.

EXAMPLE 17

Manufacture of the Memory Element Having No Intermediate Layer-1

The memory element of the present Example comprises a laminated structure of Al/PTMA/Al. The present Example is the same as Example 14 except that no intermediate layer was formed.

<Current-Voltage Characteristic>

Current-voltage characteristic of the memory element thus obtained was basically the same as that of Example 14, but the decay of the initial current in the ON-state was so fast that the period of half decay (retention time) was about 5 seconds. It is presumably attributed to the fact that the absence of the intermediate layer facilitated the recombination of electrons and holes injected into the PTMA layer serving as the switching layer, resulting in such rapid decay of the ON current.

EXAMPLE 18

Manufacture of the Memory Element Having No Intermediate Layer-2

The memory element of the present Example comprises a laminated structure of Al/CoPTMA/Al. The present Example is the same as Example 17 except that the switching layer was composed of CoPTMA, a copolymer synthesized according to Example 13.

<Current-Voltage Characteristic>

The current-voltage characteristic of the memory element thus obtained was basically the same as that of Example 14. The decay behavior of ON-current, however, was different from that of Example 17 such that the period of half decay (retention time) was longer, about 120 seconds.

EXAMPLE 19

Manufacture of the Memory Element Having Intermediate Layer Composed of Dielectric Material The structure of the memory element of the present Example comprises a laminated structure of Al/PEDOT/CR-V/PTMA/MEH-PPV/Al. The memory element of this Example was manufactured by spin-coating method, like in Example 14.

<Current-Voltage Characteristic>

Current-voltage characteristic and memory retention property of the obtained memory element were equivalent to those of Example 14.

<Evaluation>

In the memory elements of Examples 14 to 19 in accordance with the second embodiment of the present invention, the effect of the intermediate layer on the memory retention property was clearly perceived.

The invention claimed is:

1. A memory element comprising a switching layer between an anode layer and a cathode layer, said switching layer being composed of a radical polymer having electric insulating properties wherein said radical polymer is nitroxide radical polymer.

2. A memory element comprising:
a switching layer between an anode layer and a cathode layer, said switching layer being composed of a radical polymer having electric insulating properties; and
an intermediate layer partitioning said switching layer into two layers,
wherein said intermediate layer is composed of cyanoethylated polymer.

3. A memory element comprising:
a switching layer between an anode layer and a cathode layer, said switching layer being composed of a radical polymer having electric insulating properties; and
a hole injection and transport layer between the switching layer and the anode layer,
wherein said radical polymer is nitroxide radical polymer.

4. A memory element comprising:
a switching layer between an anode layer and a cathode layer, said switching layer being composed of a radical polymer having electric insulating properties; and
an electron injection and transport layer between the switching layer and the cathode layer,
wherein said radical polymer is nitroxide radical polymer.

5. A memory element comprising:
a switching layer between an anode layer and a cathode layer, said switching layer being composed of a radical polymer having electric insulating properties; and
an intermediate layer partitioning said switching layer into two layers,
wherein said radical polymer is nitroxide radical polymer.

6. A memory element comprising:
a switching layer between an anode layer and a cathode layer, said switching layer being composed of a radical polymer having electric insulating properties; and
an intermediate layer between the switching layer and one of the anode layer and the cathode layer,
wherein said radical polymer is nitroxide radical polymer.

7. A memory element comprising:
a switching layer between an anode layer and a cathode layer, said switching layer being composed of a radical polymer having electric insulating properties; and
a redox layer between the switching layer and the cathode layer,
wherein said radical polymer is nitroxide radical polymer.

8. A memory element comprising:
a switching layer between an anode layer and a cathode layer, said switching layer being composed of a radical polymer having electric insulating properties; and
an intermediate layer between the switching layer and one of the anode layer and the cathode layer,
wherein said intermediate layer is composed of cyanoethylated polymer.

9. A memory element comprising:
a switching layer between an anode layer and a cathode layer, said switching layer being composed of a radical polymer having electric insulating properties;
a redox layer between the switching layer and one of the anode layer and the cathode layer; and
an intermediate layer between the switching layer and the redox layer,
wherein said intermediate layer is composed of cyanoethylated polymer.

* * * * *